United States Patent
Huang et al.

(10) Patent No.: US 11,355,399 B2
(45) Date of Patent: Jun. 7, 2022

(54) GAP PATTERNING FOR METAL-TO-SOURCE/DRAIN PLUGS IN A SEMICONDUCTOR DEVICE

(71) Applicant: Taiwan Semiconductor Manufacturing Company Limited, Hsinchu (TW)

(72) Inventors: Yu-Lien Huang, Jhubei (TW); Ching-Feng Fu, Taichung (TW); Huan-Just Lin, Hsinchu (TW); Fu-Sheng Li, Taichung (TW); Tsai-Jung Ho, Xihu Township (TW); Bor Chiuan Hsieh, Taoyuan (TW); Guan-Xuan Chen, Taoyuan (TW); Guan-Ren Wang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/878,005

(22) Filed: May 19, 2020

(65) Prior Publication Data
US 2021/0366780 A1  Nov. 25, 2021

(51) Int. Cl.
*H01L 21/8234* (2006.01)
*H01L 21/768* (2006.01)
(Continued)

(52) U.S. Cl.
CPC .. *H01L 21/823475* (2013.01); *H01L 21/7684* (2013.01); *H01L 21/76805* (2013.01);
(Continued)

(58) Field of Classification Search
CPC .......... H01L 21/823475; H01L 23/535; H01L 21/76895; H01L 21/76805;
(Continued)

(56) References Cited

U.S. PATENT DOCUMENTS 9,997,412 B1 * 6/2018 Bae ..................... H01L 23/5226
10,374,040 B1    8/2019 Chanemougame et al.
(Continued)

FOREIGN PATENT DOCUMENTS

KR      20200026732 A      3/2020

OTHER PUBLICATIONS

German Office action issued in German Application No. 10 2020 114 001.0 dated Mar. 19, 2021, 12 Pages.
(Continued)

*Primary Examiner* — Sonya McCall-Shepard
(74) *Attorney, Agent, or Firm* — Harrity & Harrity, LLP

(57) ABSTRACT

A method may include forming a mask layer on top of a first dielectric layer formed on a first source/drain and a second source/drain, and creating an opening in the mask layer and the first dielectric layer that exposes portions of the first source/drain and the second source/drain. The method may include filling the opening with a metal layer that covers the exposed portions of the first source/drain and the second source/drain, and forming a gap in the metal layer to create a first metal contact and a second metal contact. The first metal contact may electrically couple to the first source/drain and the second metal contact may electrically couple to the second source/drain. The gap may separate the first metal contact from the second metal contact by less than nineteen nanometers.

20 Claims, 35 Drawing Sheets

(51) Int. Cl.
*H01L 23/535* (2006.01)
*H01L 27/088* (2006.01)
*H01L 29/08* (2006.01)
*H01L 29/417* (2006.01)
*H01L 29/66* (2006.01)
*H01L 29/06* (2006.01)
*H01L 29/78* (2006.01)

(52) U.S. Cl.
CPC .. *H01L 21/76837* (2013.01); *H01L 21/76895* (2013.01); *H01L 21/823418* (2013.01); *H01L 21/823431* (2013.01); *H01L 23/535* (2013.01); *H01L 27/0886* (2013.01); *H01L 29/0847* (2013.01); *H01L 29/41791* (2013.01)

(58) Field of Classification Search
CPC ........... H01L 21/76837; H01L 27/0886; H01L 29/0847; H01L 21/823431; H01L 29/41791; H01L 21/823418; H01L 21/7684; H01L 21/823821; H01L 21/845; H01L 29/66795–66818; H01L 29/785–786; H01L 2029/7857–7858; H01L 27/0924; H01L 27/10826; H01L 27/10879; H01L 27/1211; H01L 21/768–76897; H01L 21/823871; H01L 21/823814; H01L 21/823828; H01L 29/0649; H01L 29/0653; H01L 29/0843; H01L 29/40; H01L 29/41; H01L 29/45–458; H01L 29/495; H01L 29/4958

See application file for complete search history.

(56) References Cited

U.S. PATENT DOCUMENTS

| | | | |
|---|---|---|---|
| 10,566,246 B1* | 2/2020 | Wu | H01L 21/28518 |
| 10,916,470 B2* | 2/2021 | Kamineni | H01L 21/76897 |
| 10,930,564 B2 | 2/2021 | Wu et al. | |
| 2018/0108749 A1 | 4/2018 | Greene et al. | |
| 2018/0166327 A1 | 6/2018 | Hsiao et al. | |
| 2020/0135724 A1 | 4/2020 | Lin et al. | |

OTHER PUBLICATIONS

Korean Office Action issued in Application No. 10-2020-0106129, dated Oct. 22, 2021, 4 Pages.

* cited by examiner

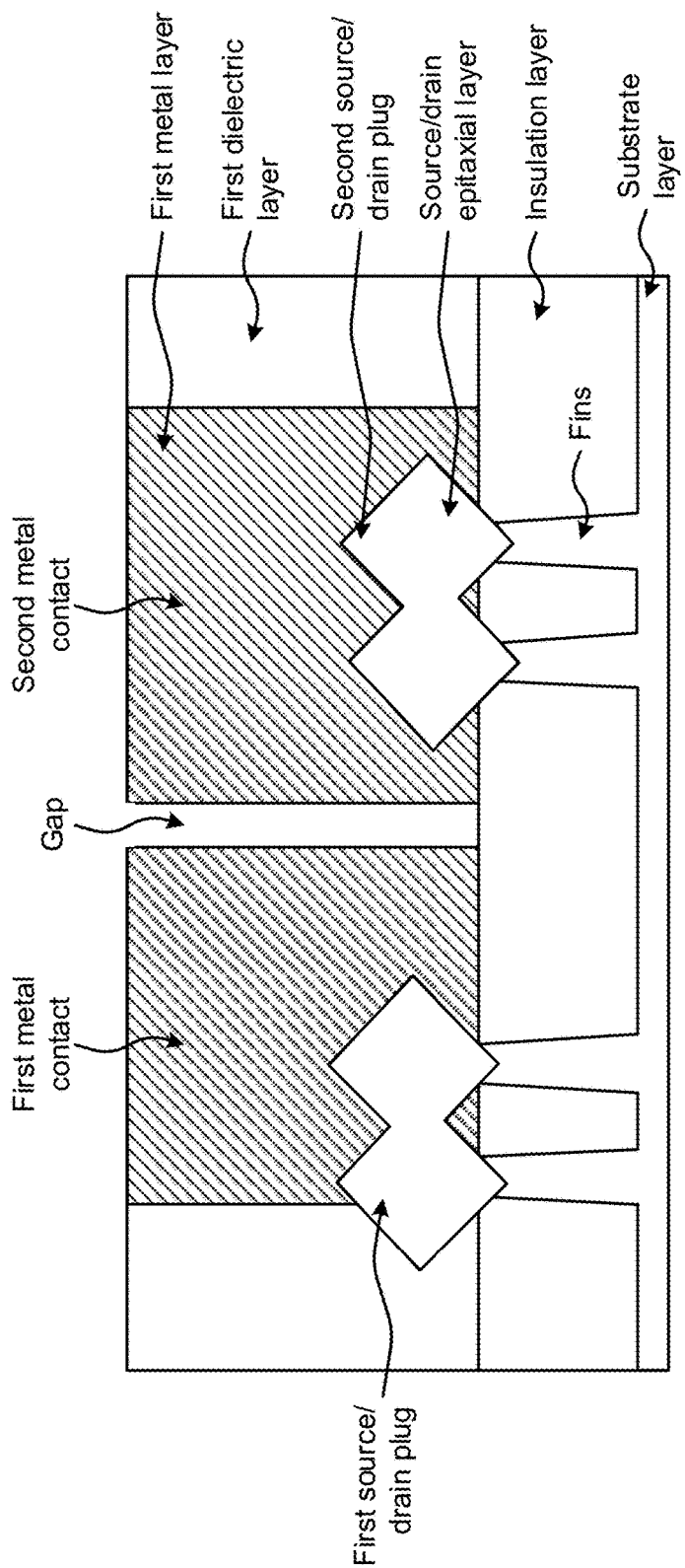

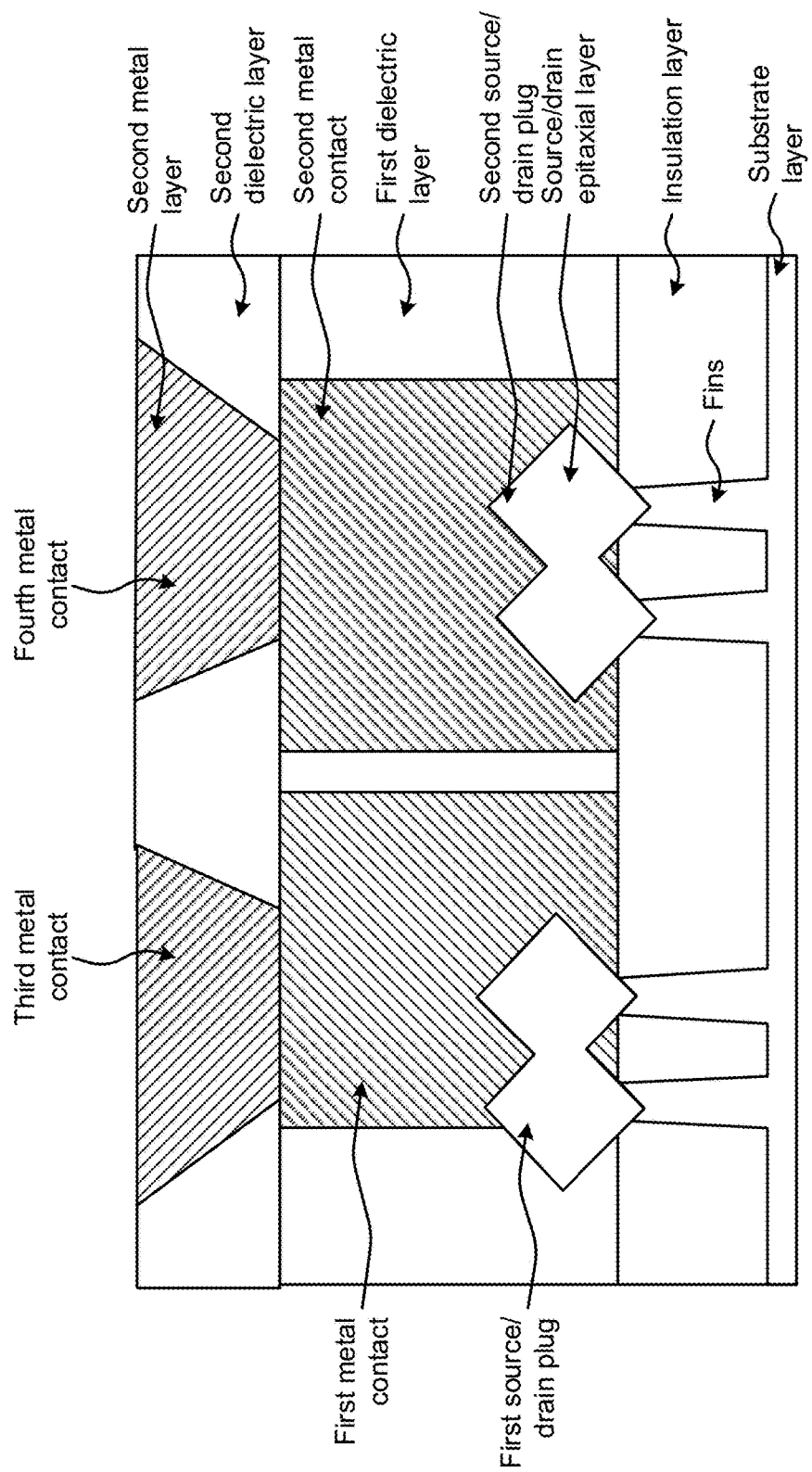

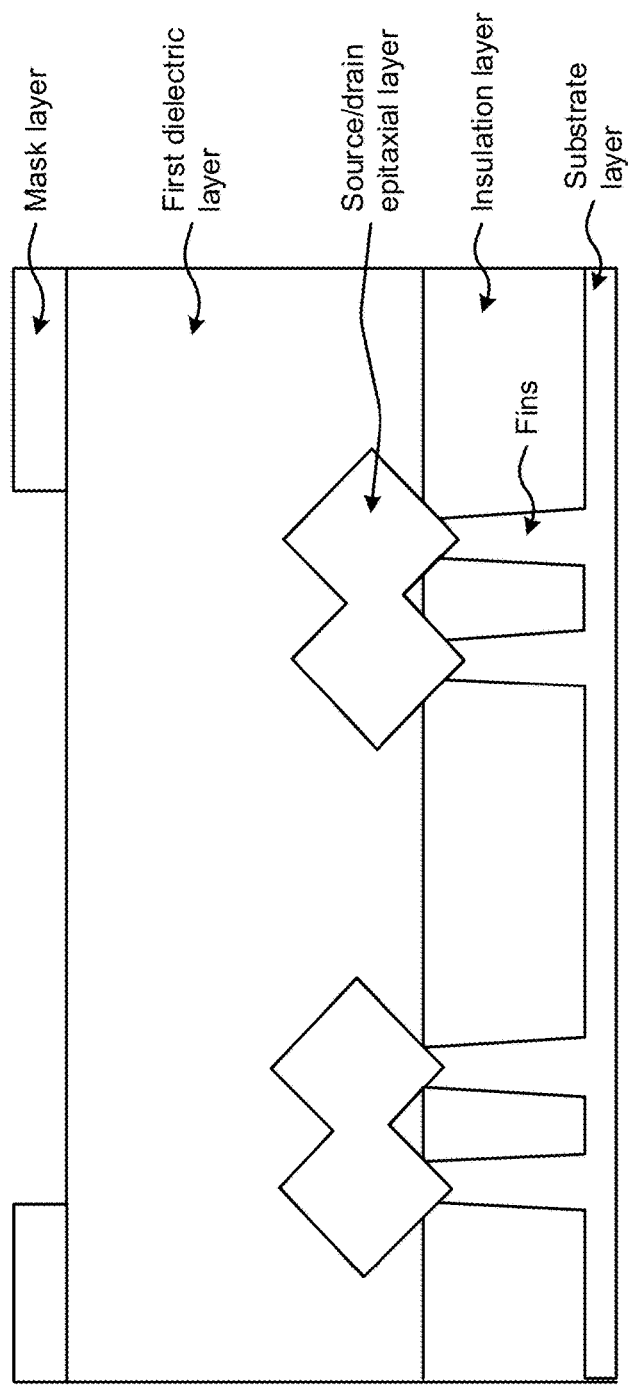

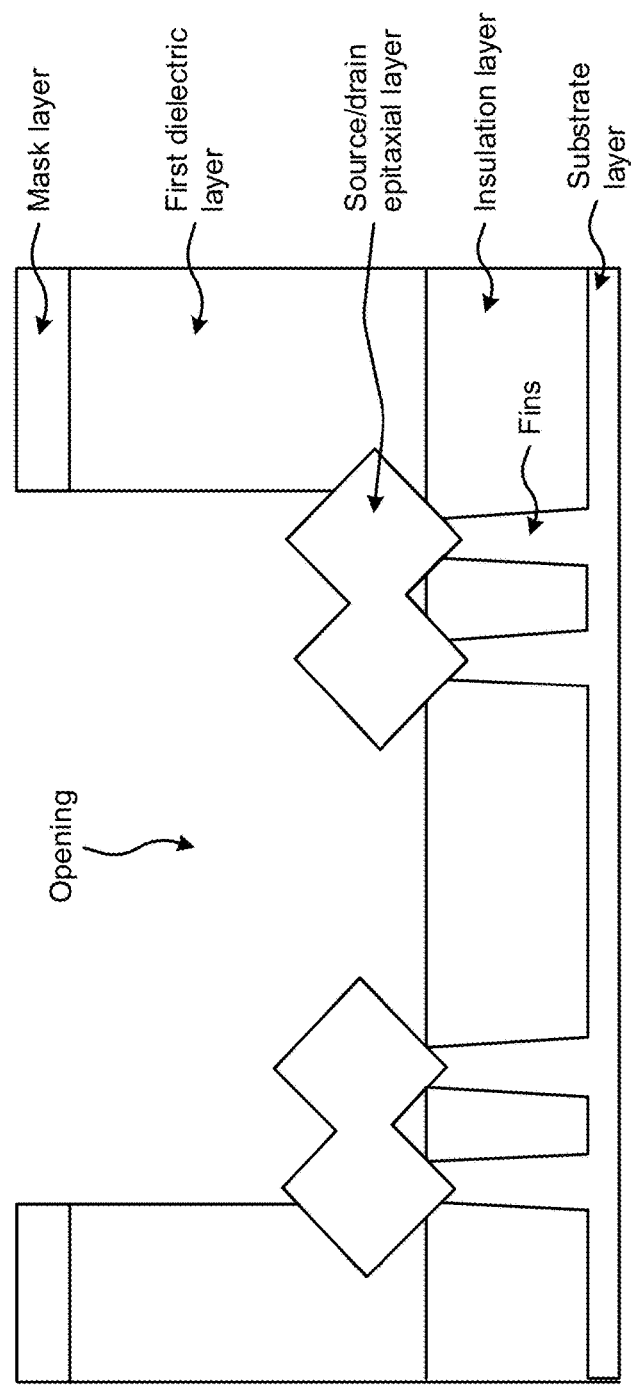

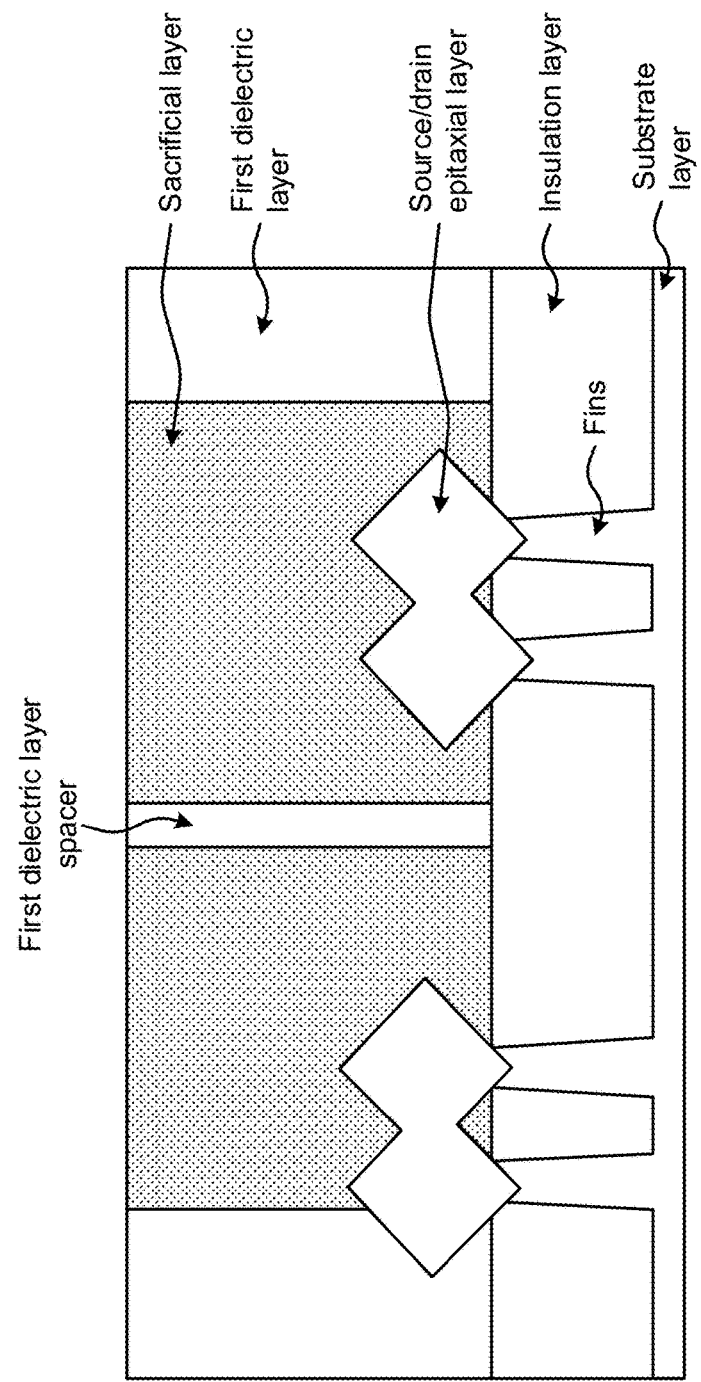

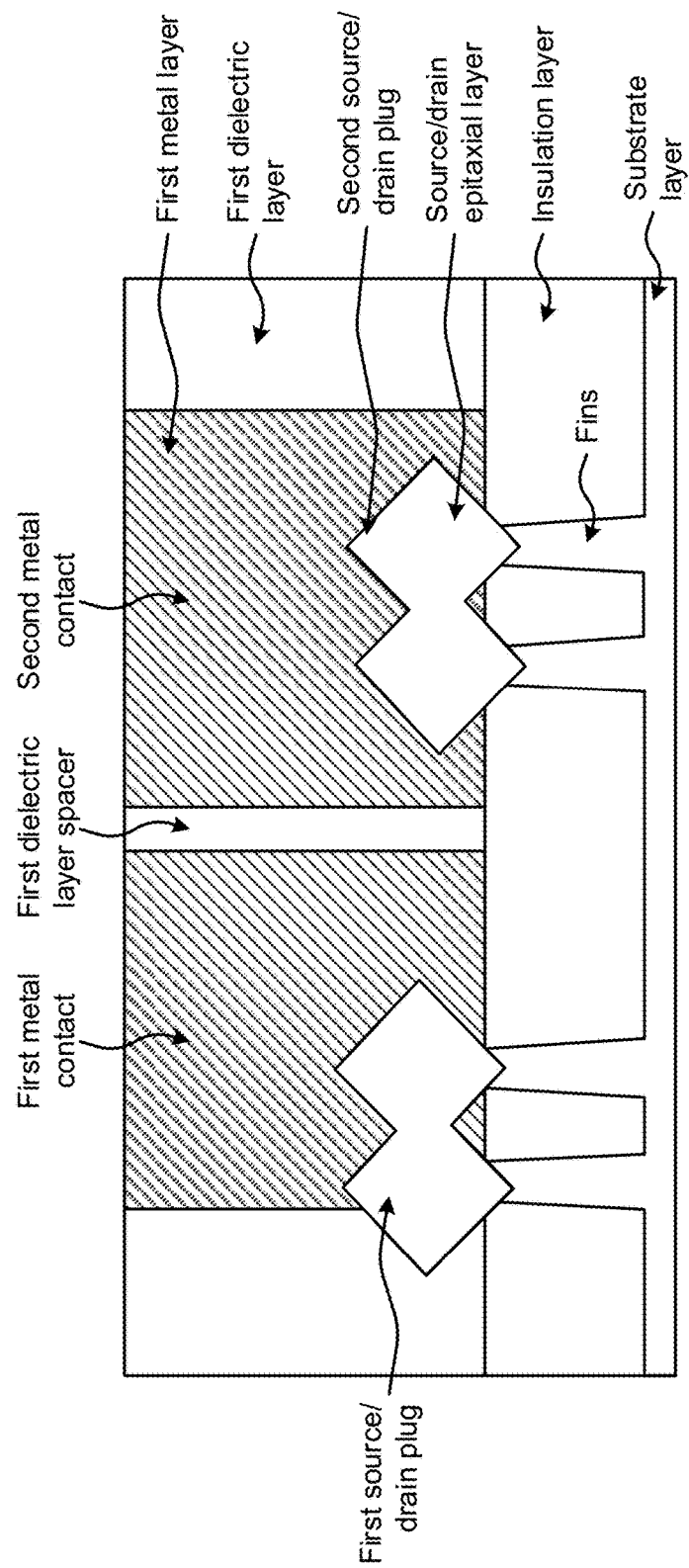

GAP PATTERNING FOR METAL-TO-SOURCE/DRAIN PLUGS IN A SEMICONDUCTOR DEVICE

BACKGROUND

A fin field-effect transistor (finFET) is a multi-gate device that includes a metal-oxide-semiconductor field-effect transistor (MOSFET) built on a substrate. A gate is placed on two, three, or four sides of a channel or wrapped around the channel, forming a double gate structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
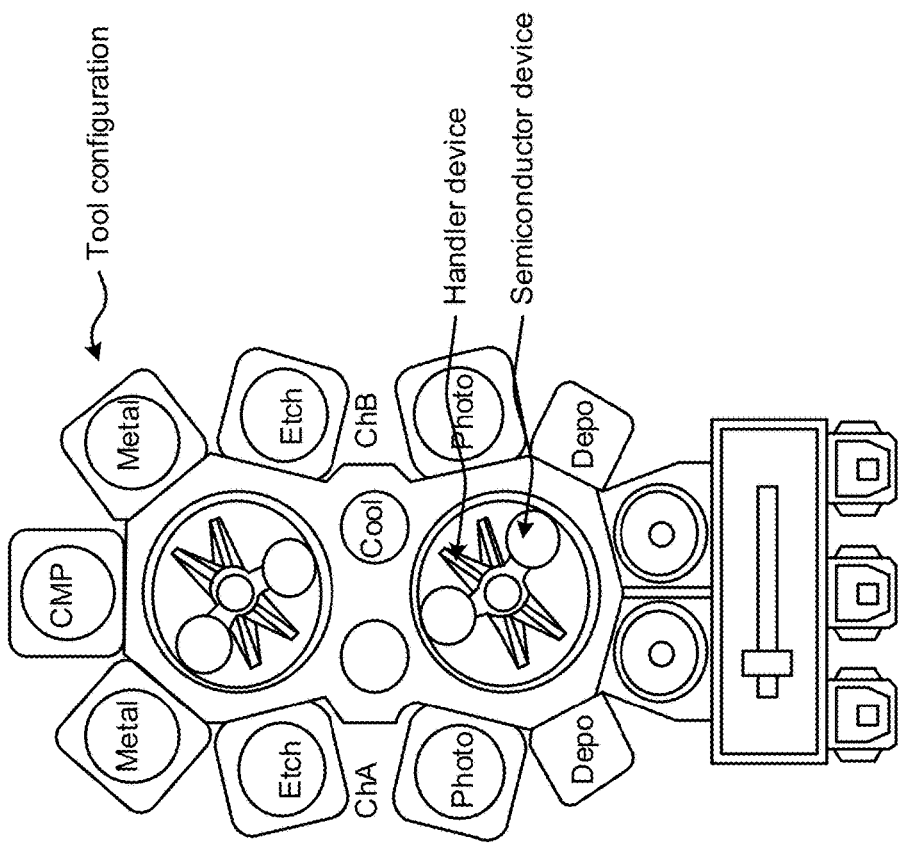
FIG. 1 is a diagram of an example implementation of semiconductor processing tools described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some instances, a semiconductor device, such as a finFET, includes metal-to-source/drain plugs (e.g., a source/drain epitaxial layer) that are electrically coupled to other components of the semiconductor device using an island patterning technique. The island patterning technique includes patterning a photoresist layer between the metal-to-source/drain plugs to create openings that expose the metal-to-source/drain plugs. The openings are filled with metal contacts that electrically couple with corresponding metal-to-source/drain plugs. In the island patterning technique, the metal contacts are separated by at least a minimum distance (e.g., at least nineteen (19) nanometers (nm)). However, some semiconductor designs may indicate that the metal contacts are to be separated by less than the minimum distance provided by the island patterning technique. Furthermore, the island patterning technique may result in a less of an interface between a source/drain and the corresponding metal-to-source/drain plugs, which may cause unwanted increases in resistance of the corresponding metal-to-source/drain plugs.

According to some implementations described herein, a first method for manufacturing a semiconductor device (e.g., a finFET) is based on gap patterning for metal-to-source/drain plugs in the semiconductor device. For example, the first method may include forming a mask layer on top of a first dielectric layer formed on a first source/drain plug and a second source/drain plug, and creating an opening in the mask layer and the first dielectric layer that exposes portions of the first source/drain plug and the second source/drain plug. The first method may include filling the opening with a metal layer that covers the exposed portions of the first source/drain plug and the second source/drain plug, and forming a gap in the metal layer to create a first metal contact and a second metal contact. The first metal contact may electrically couple to the first source/drain plug and the second metal contact may electrically couple to the second source/drain plug. The gap may separate the first metal contact from the second metal contact by less than nineteen nanometers. The first method may include filling the gap with a material used for the first dielectric layer.

According to some implementations described herein, a second method for manufacturing a semiconductor device (e.g., a finFET) is based on gap patterning for metal-to-source/drain plugs in the semiconductor device. For example, the second method may include forming a mask layer on top of a first dielectric layer formed on a first source/drain plug and a second source/drain plug, and creating an opening in the mask layer and the first dielectric layer that exposes portions of the first source/drain plug and the second source/drain plug. The second method may include filling the opening with a sacrificial layer that covers the exposed portions of the first source/drain plug and the second source/drain plug, and forming a gap in the sacrificial layer. The second method may include filling the gap with a material used for the first dielectric layer to form a spacer, and removing the sacrificial layer to create a first opening that exposes a portion of the first source/drain plug and a second opening that exposes a portion of the second source/drain plug. The second method may include filling the first opening with a metal to form a first metal contact, and filling the second opening with a metal to form a second metal contact. The first metal contact may electrically couple to the first source/drain plug and the second metal contact may electrically couple to the second source/drain plug. The spacer may separate the first metal contact from the second metal contact by less than nineteen nanometers.

In this way, the first and second methods for manufacturing a semiconductor device may be based on gap patterning for metal-to-source/drain plugs in the semiconductor device. The first and second methods enable metal contacts electrically coupled to corresponding metal-to-source/drain plugs of the semiconductor device to be separated by less than the minimum distance (e.g., less than nineteen nm) provided by the island patterning technique. Thus, the first and second methods may be utilized for the semiconductor designs that indicate that metal contacts are to be separated by less than a particular distance (e.g., nineteen nm). Furthermore, the first and second methods provide a more of an interface between a source/drain and the corresponding metal-to-source/drain plugs (e.g., relative to the island patterning technique), which reduces resistance of the corresponding metal-to-source/drain plugs (e.g., relative to the island patterning technique).

FIG. 1 is a diagram of an example implementation 100 of semiconductor processing tools described herein. As shown, a tool configuration may include one or more deposition (depo) tools, one or more photoresist (photo) tools, one or more etch tools, one or more metal tools, one or more chemical-mechanical polishing (CMP) tools, and/or the like. Semiconductor devices may be provided to one or more of the aforementioned tools via a handler device (e.g., a robotic arm, multiple robotic arms, and/or the like). Although FIG. 1 shows different modules (e.g., deposition, photolithography, etch, and/or the like) in same tool configuration, the different modules may be provided in different tool configurations. FIG. 1 is provided to explain process sequences. In some implementations, the tool configuration is utilized to produce a semiconductor device described below in connection with FIGS. 2A-4.

The deposition tool may include a tool that deposits materials on the semiconductor device, such as an insulation layer, a dielectric layer, a mask layer, a metal layer, and/or the like. Deposition is any process that grows, coats, or otherwise transfers a material onto a semiconductor device. The deposition tool may include a tool that forms a thin film of material on a semiconductor device by physical vapor deposition (PVD), chemical vapor deposition (CVD), atomic layer deposition (ALD), molecular beam epitaxy (MBE), electrochemical deposition (ECD), and/or the like. In some implementations, the deposition includes a chamber that enables deposition of layers on the semiconductor device. The chamber may be filled with a gas (e.g., an argon gas) that is maintained at a particular temperature, is provided at a particular flow rate, is maintained at a particular pressure, and/or the like, depending on the material deposited on the semiconductor device.

The photoresist tool may include a tool that removes materials from or provides materials to a semiconductor device based on a photoresist layer (e.g., a photoresist mask) applied to the semiconductor device. A photoresist is a light-sensitive material used in several processes (e.g., photolithography, photoengraving, and/or the like) to form a patterned coating on a surface of a semiconductor device. The photoresist tool may coat the semiconductor device with a photo-sensitive organic material, and may apply a patterned mask to the semiconductor device to block light, so that only unmasked regions of the photo-sensitive organic material will be exposed to light. The photoresist tool or another tool (e.g., the etch tool) may apply a solvent, called a developer, to the semiconductor device. In the case of a positive photoresist, the photo-sensitive organic material is degraded by light and the developer dissolves away regions that are exposed to light, leaving behind a coating where the mask is placed. In the case of a negative photoresist, the photo-sensitive organic material is strengthened (e.g., either polymerized or cross-linked) by light, and the developer dissolves away only regions that are not exposed to light, leaving behind a coating in areas where the mask is not placed.

The etch tool may include a tool that removes materials from a surface of a semiconductor device. In some implementations, a portion of the semiconductor device is protected from an etchant by a masking material that resists etching. For example, the masking material may include a photoresist that is patterned using photolithography. The etch tool may perform a wet etching process or a dry (e.g., plasma) etching process on the semiconductor device. In the wet etching process, the semiconductor device may be immersed in a batch of a liquid-phase (e.g., wet) etchant, which may be agitated to achieve process control. For example, a buffered hydrofluoric acid (BHF) may be used to etch silicon dioxide over a silicon substrate. The plasma etching process may operate in several modes based on adjusting parameters of the plasma. For example, the plasma etching process may operate at a pressure in a range from approximately 0.01 Torr to approximately 5 Torr. The plasma produces energetic free radicals, that are neutrally charged and that react at a surface of the semiconductor device. Plasma etching may be isotropic (e.g., exhibiting a lateral undercut rate on a patterned surface approximately the same as a downward etch rate) or anisotropic (e.g., exhibiting a smaller lateral undercut rate than the downward etch rate). A source gas for the plasma may include small molecules rich in chlorine or fluorine. For example, carbon tetra fluorine may be utilized to etch silicon and chlorine may be utilized to etch aluminum, trifluoro methane may be used to etch silicon dioxide and silicon nitride, and/or the like. The plasma may also include oxygen that is used to oxidize photoresist and facilitate removal of the photoresist.

The metal tool may include a tool that forms metal layers on the semiconductor device. In some implementations, the metal tool includes a chamber that enables deposition of the metal layers on the semiconductor device. The chamber may be filled with a gas (e.g., an argon gas) that is maintained at a particular temperature (e.g., 510° C., 530° C., and/or the like) and is provided at a particular flow rate (e.g., 20, 25, 30 and/or the like standard cubic centimeters per minute (sccm)). In some implementations, the metal tool may include a heater component, a target component, and a magnetron that are provided within the chamber of the metal tool. The heater component may include a support pad that is sized and shaped to support the semiconductor device. The support pad may include one or more heating elements that generate heat that is transferred to the semiconductor device based on the semiconductor device contacting the support pad. The target component may include a material that is used to create metal layers on the semiconductor device, via a technique known as thin film deposition. For example, the target component may include an aluminum material, a copper material, an aluminum copper material, and/or the like. The magnetron may include multiple magnetic columns that generate a magnetic field when the magnetron is rotated.

In operation, since the magnetron is located behind the target component, plasma generated from the target component may be confined to a target surface of the semiconductor device. Rotation of the magnetron may generate a magnetic field that forms a closed-loop annular path acting as an electron trap that reshapes trajectories of secondary electrons ejected from the target component into a cycloidal path, which increases a probability of ionization of a sputtering gas within the chamber. Inert gases (e.g., argon) may be employed as the sputtering gas because inert gases tend not to react with the target component or combine with any process gases and because inert gases produce higher sputtering and deposition rates due to high molecular weight. Positively charged argon ions from the plasma may be accelerated toward the negatively biased target component, resulting in material being dislodged from a surface of the target component and onto the semiconductor device.

The CMP tool may include a tool that smooths surfaces of a semiconductor device with a combination of chemical and mechanical forces (e.g., chemical etching and free abrasive polishing). The CMP tool may utilize an abrasive and corrosive chemical slurry in conjunction with a polishing pad and retaining ring (e.g., typically of a greater diameter than the semiconductor device). The polishing pad and the semiconductor device are pressed together by a dynamic polishing head and held in place by the retaining ring. The dynamic polishing head is rotated with different axes of rotation to remove material and even out any irregular topography of the semiconductor device, making the semiconductor device flat or planar.

As indicated above, FIG. 1 is provided merely as one or more examples. Other examples may differ from what is described with regard to FIG. 1.

Figure 2A:
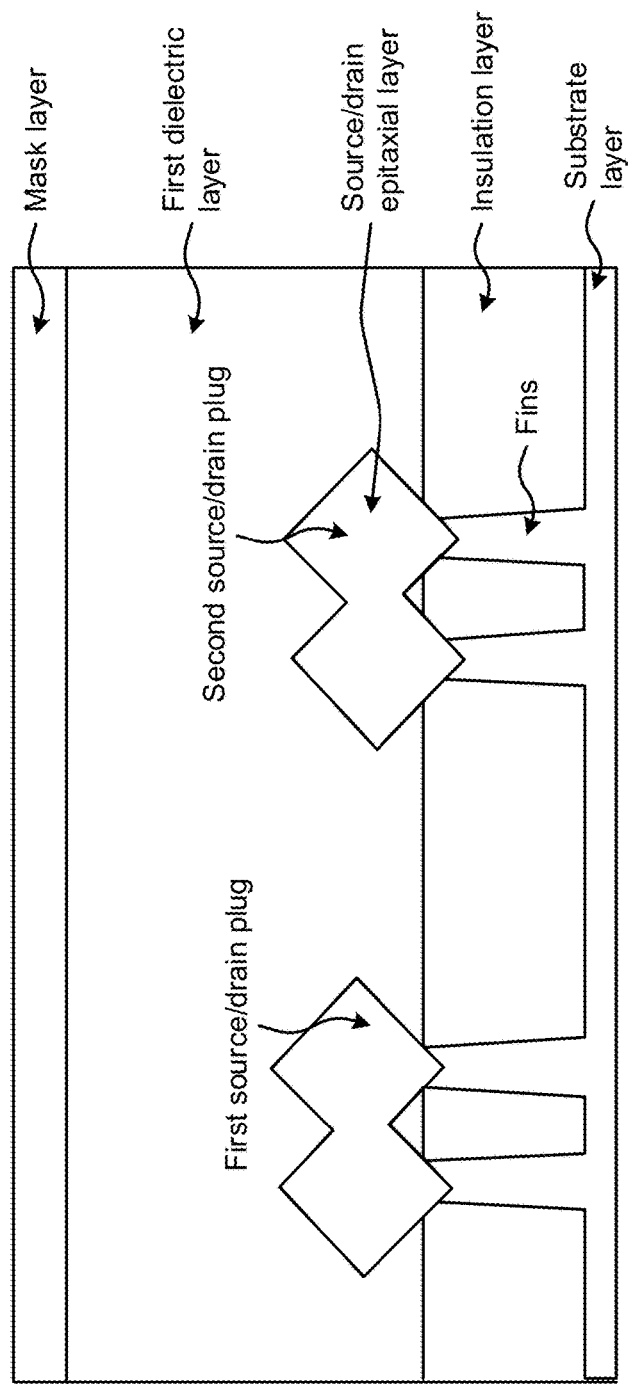
FIGS. 2A-2N are diagrams of one or more example operations involved in manufacturing an example semiconductor device described herein.

FIGS. 2A-2N are diagrams of one or more example operations 200 involved in manufacturing an example semiconductor device (e.g., a logic device, a memory device, a finFET, a MOSFET, and/or the like). As shown in FIG. 2A, the semiconductor device may include a substrate layer with multiple fins, an insulation layer, a source/drain epitaxial layer, and a first dielectric layer. The substrate layer and the multiple fins may include a conductive or semi-conductive material, such as silicon, aluminum, copper, and/or the like. The insulation layer may include a material that insulates the substrate layer and the multiple fins, such as tantalum nitride, silicon oxide, silicate glass, silicon oxycarbide, and/or the like. In some implementations, the insulation layer is formed by shallow trench isolation to prevent electric current leakage between adjacent fins of the substrate layer. The source/drain epitaxial layer may include a silicon germanium formed via epitaxial growth. In some implementations, the source/drain epitaxial layer may form a first source/drain plug that is electrically coupled to a first pair of fins of the substrate layer, and a second source/drain plug that is electrically coupled to a second pair of fins of the substrate layer. The first dielectric layer may include a material that electrically insulates the first source/drain plug and the second source/drain plug from each other and from other components of the semiconductor device. For example, the first dielectric layer may include, silicon nitride, silicon oxide, a low-k material and/or the like.

As further shown in FIG. 2A, and by reference number 205, a mask layer may be formed on the semiconductor device. For example, the mask layer may be formed on top of the first dielectric layer of the semiconductor device. The mask layer may include a metal oxide, titanium nitride (TiN), tungsten carbide (WC), and/or the like. In some implementations, the deposition tool and/or the metal tool of the tool configuration, described above in connection with FIG. 1, may be utilized to form the mask layer on top of the first dielectric layer.

Figure 2B:
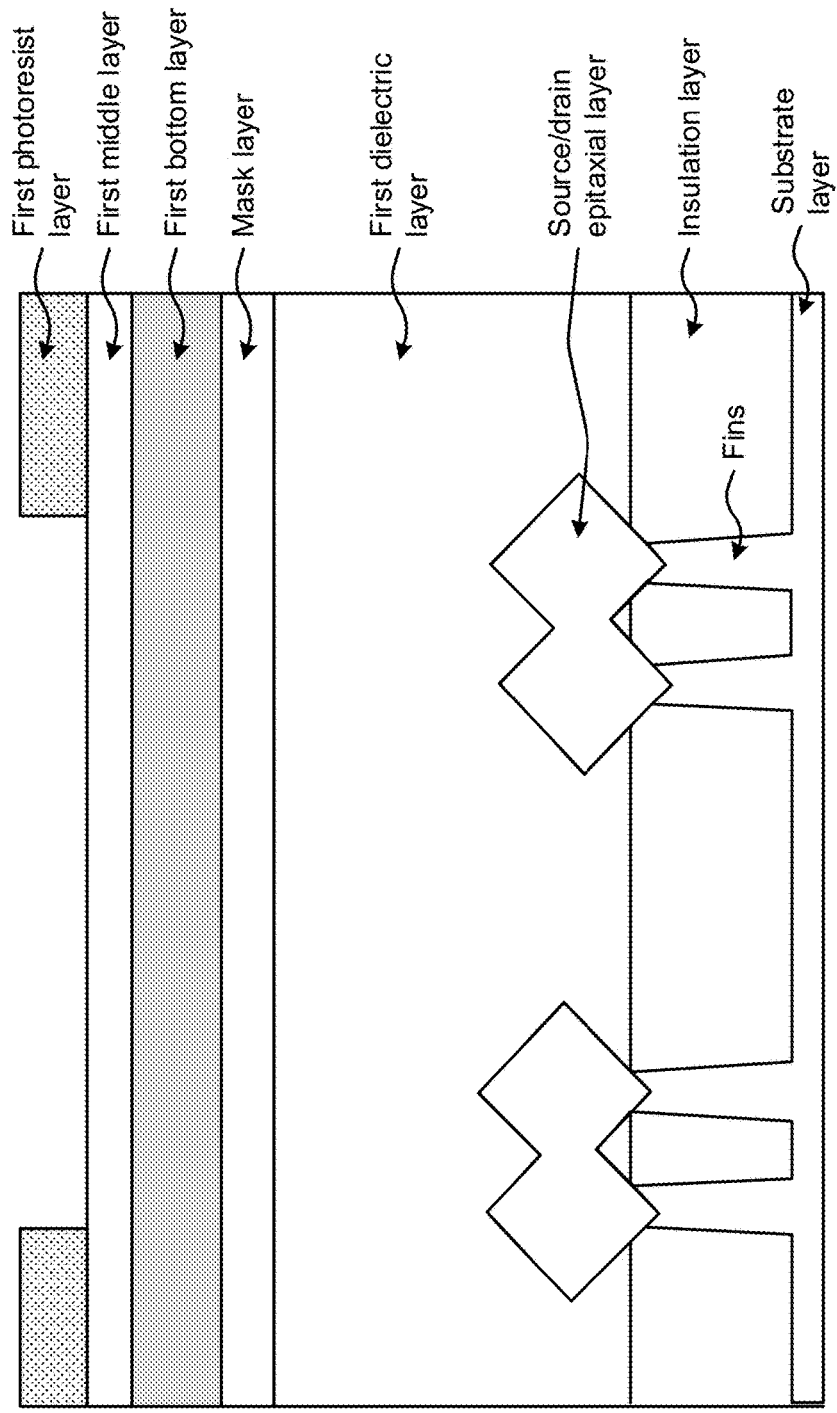

As shown in FIG. 2B, and by reference number 210, a first bottom layer may be formed on top of the mask layer, a first middle layer may be formed on top of the first bottom layer, and a first photoresist layer may be formed on portions of the first middle layer. The first bottom layer may include an organic material, such as carbon, oxygen, hydrogen, a thermosetting polyarene ether, and/or the like. The first middle layer may include an antireflective coating (ARC) material, such as silicon, oxygen, nitrogen, silicon oxide, a silicon-containing ARC material, and/or the like. The first photoresist layer may include a photoresist material, such as a photopolymeric photoresist (e.g., methyl methacrylate), a photodecomposing photoresist (e.g., diazonaphthaquinone), a photocrosslinking photoresist, and/or the like. In some implementations, the photoresist layer is patterned on the portions of the first middle layer so that an opening may be formed to expose the first source/drain plug and the second source/drain plug, as described below. In some implementations, the photoresist tool of the tool configuration, described above in connection with FIG. 1, may be utilized to form the first bottom layer on top of the mask layer, to form the first middle layer on top of the first bottom layer, and to form the first photoresist layer on the portions of the first middle layer.

Figure 2C:
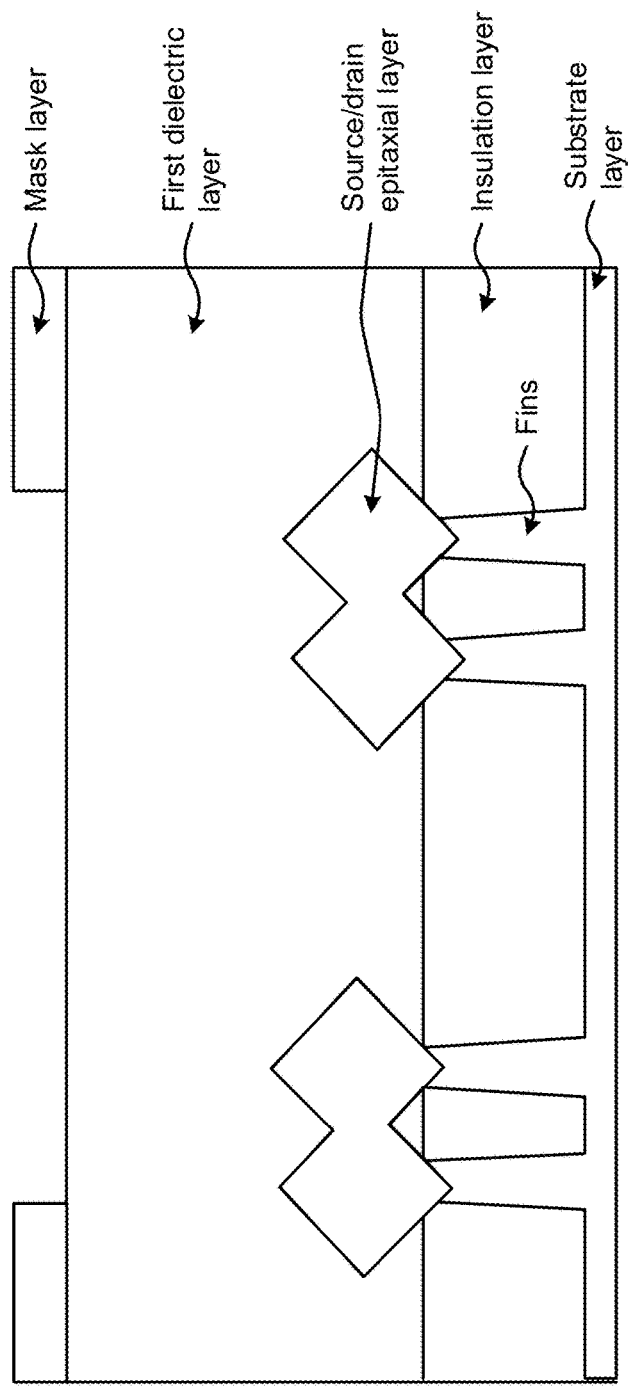

As shown in FIG. 2C, and by reference number 215, the first bottom layer, the first middle layer, the first photoresist layer, and a portion of the mask layer may be removed based on formation of the first photoresist layer on the portions of the first middle layer. Such removal transfers the pattern to mask layer and portions of the mask layer to remain on top of the first dielectric layer, as shown in FIG. 2C. In some implementations, one or more photolithography and/or etching operations may be performed to remove the first bottom layer, the first middle layer, the first photoresist layer, and the portion of the mask layer. For example, one or more photolithographic operations may be performed to remove portions of the first bottom layer, the first middle layer, and the mask layer not formed under the first photoresist layer. One or more etching operations may be performed to remove remaining portions of the first bottom layer, the first middle layer, and the first photoresist layer from the semiconductor device. For example, a dry etching operation ma be performed, utilizing carbon tetrafluoride gas, $CF_3H$ gas, and/or the like to etch the first middle layer; $SO_2$, $O_2$ gas, and/or the like to etch the first bottom layer; carbon tetrafluoride gas, $C_4F_6$ gas, and/or the like to etch the first mask layer, after the first photoresist pattern is transferred to the first mask layer. In some implementations, the photoresist tool and/or the etch tool of the tool configuration, described above in connection with FIG. 1, may be utilized to etch the first bottom layer, the first middle layer, the first photoresist layer, and the portion of the mask layer based on formation of the first photoresist layer on the portions of the first middle layer.

Figure 2D:
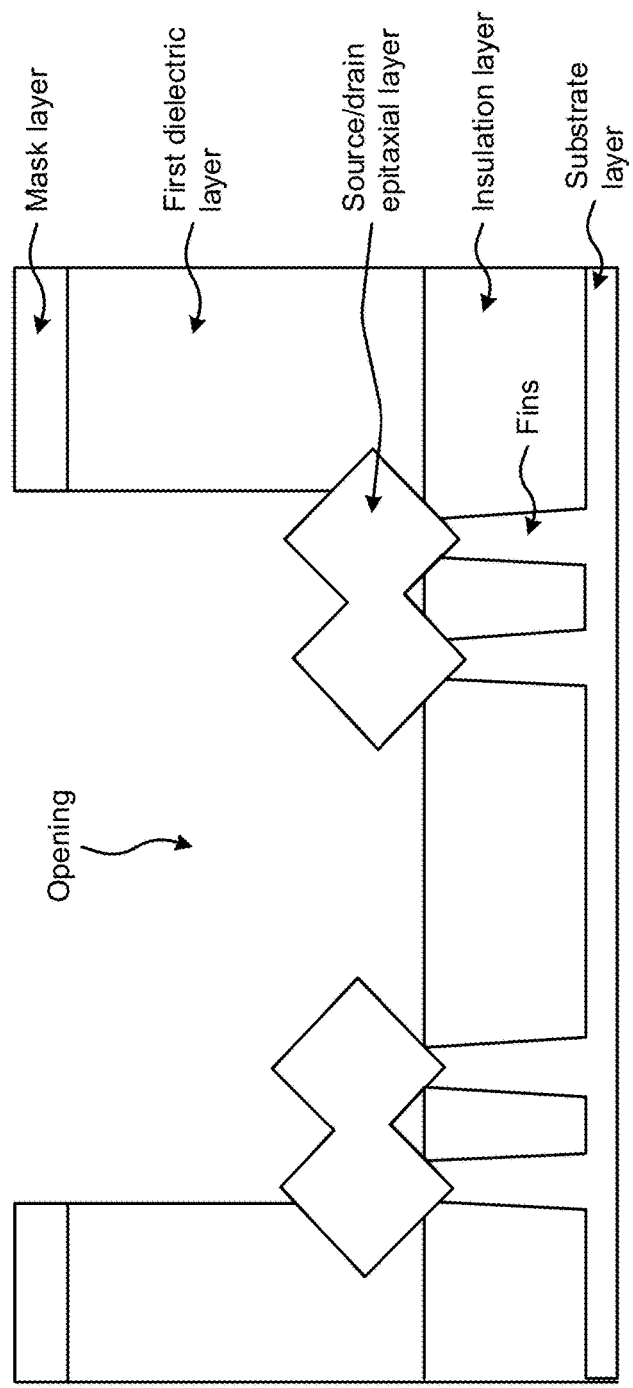

As shown in FIG. 2D, and by reference number 220, the first dielectric layer not formed below the portion of the mask layer may be removed to form an opening that exposes the source/drain epitaxial layer (e.g., the first source/drain plug and the second source/drain plug). In some implementations, one or more etching operations may be performed to remove the first dielectric layer not formed below the portion of the mask layer and to form the opening that exposes the source/drain epitaxial layer. For example, a dry etching operation, utilizing carbon tetrafluoride gas, hexafluorocyclobutane gas, octafluorocyclobutane gas, oxygen gas, and/or the like, may be performed to remove the first dielectric layer not formed below the portion of the mask layer and to form the opening that exposes the source/drain epitaxial layer (e.g., the first source/drain plug and the second source/drain plug). In some implementations, there may be a CESL (e.g., a SiN, etch stop layer) layer deposited before the first dielectric layer. In some implementations, the etch tool of the tool configuration, described above in connection with FIG. 1, may be utilized to remove the first dielectric layer not formed below the portion of the mask layer and to form the opening that exposes the source/drain epitaxial layer.

Figure 2E:
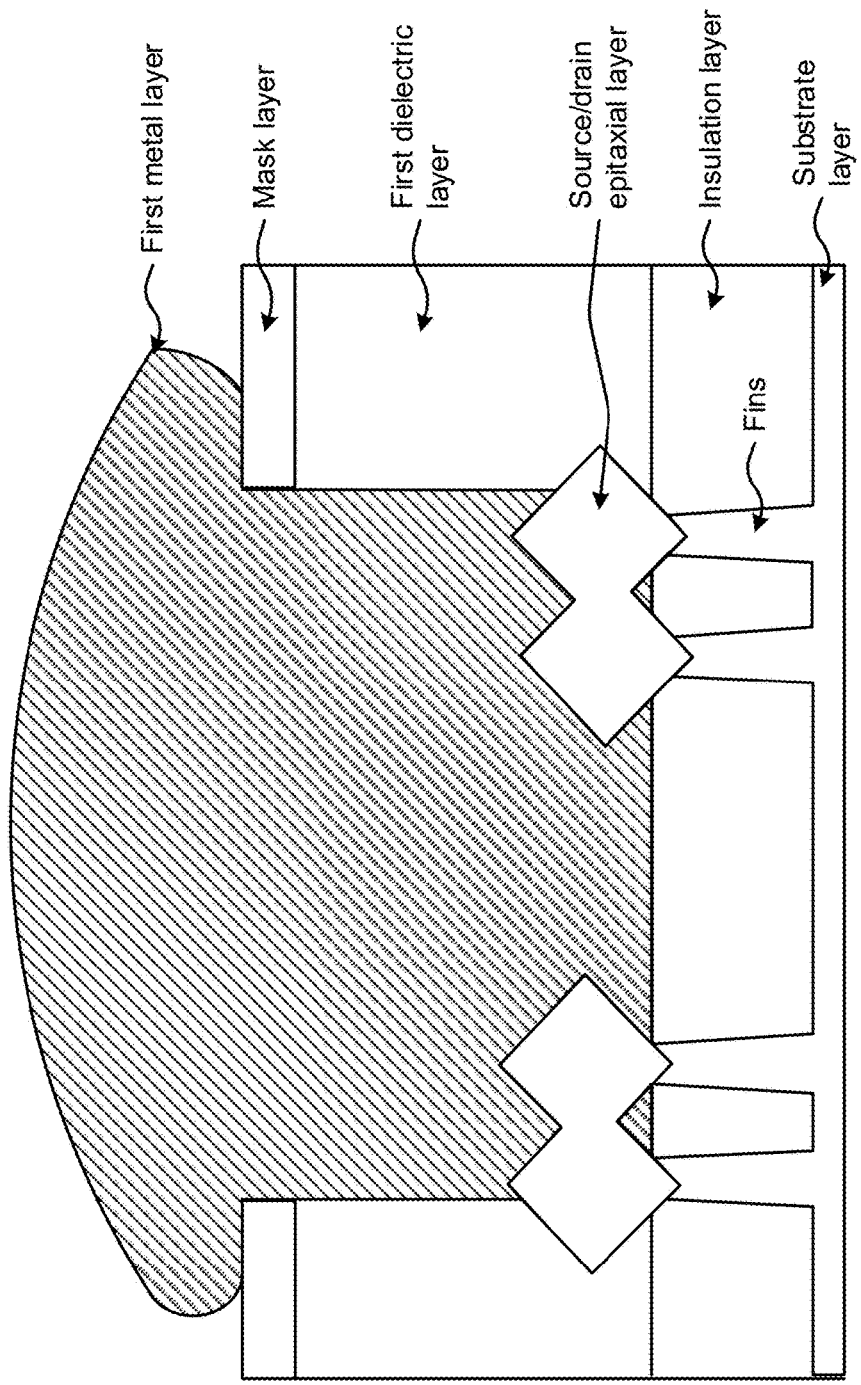

As shown in FIG. 2E, and by reference number 225, the opening in the first dielectric layer and the mask layer may be filled with a first metal layer that covers the source/drain epitaxial layer (e.g., the first source/drain plug and the second source/drain plug). The first metal layer may include a metal, such as cobalt, tungsten, aluminum, copper, and/or the like. In some implementations, a metal deposition operation may be performed to fill the opening in the first dielectric layer and the mask layer with the first metal layer that covers the source/drain epitaxial layer. For example, PVD, CVD, ALD, MBE, ECD, and/or the like may be performed to fill the opening in the first dielectric layer and the mask layer with the first metal layer that covers the source/drain epitaxial layer. In some implementations, the deposition tool and/or the metal tool of the tool configuration, described above in connection with FIG. 1, may be utilized to fill the opening in the first dielectric layer and the mask layer with the first metal layer that covers the source/drain epitaxial layer. In some implementations, there may be a barrier layer (e.g. TaN, TiN, and/or the like) deposited before metal filling. In some implementations, the first metal layer provides a better interface with the source/drain epitaxial layer (e.g., the first source/drain plug and second source/drain plug), relative to the island patterning technique, which reduces resistance between the first metal layer and the source/drain epitaxial layer, relative to the island patterning technique.

Figure 2F:
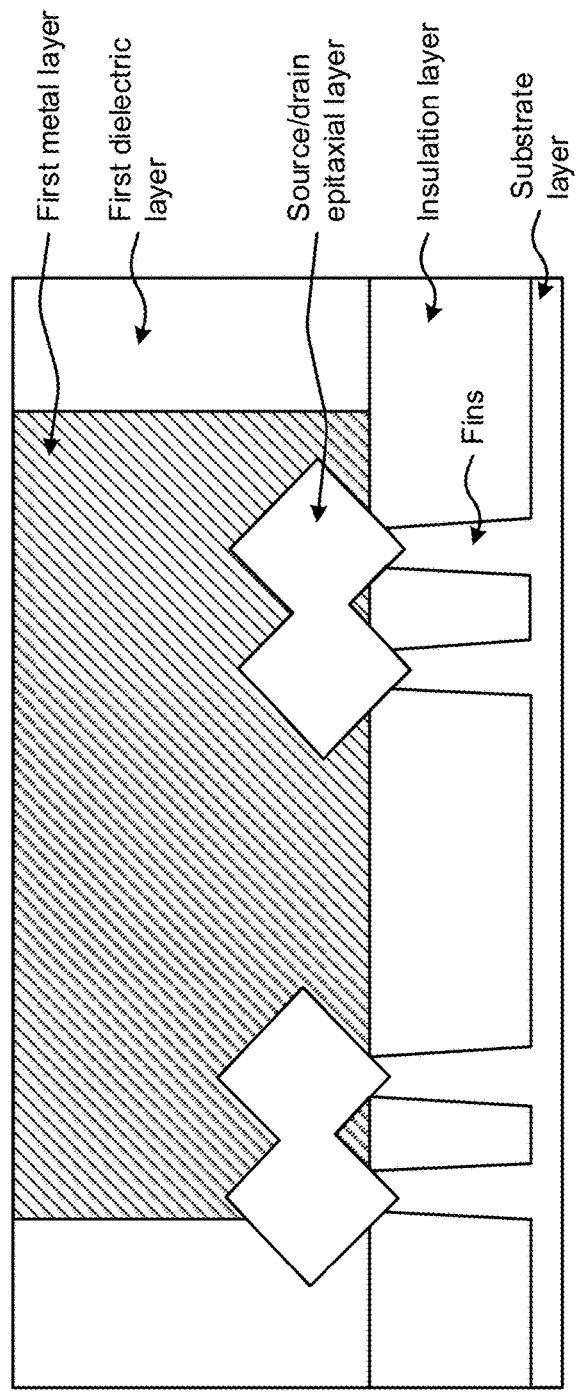

As shown in FIG. 2F, and by reference number 230, the first metal layer may be polished to be substantially planar with and/or under the first dielectric layer and to remove the mask layer. In some implementations, a CMP operation may be performed to polish the first metal layer to be substantially planar with the first dielectric layer and to remove the mask layer. In some implementations, the CMP tool of the tool configuration, described above in connection with FIG. 1, may be utilized to polish the first metal layer to be substantially planar with/or under the first dielectric layer and to remove the mask layer.

Figure 2G:
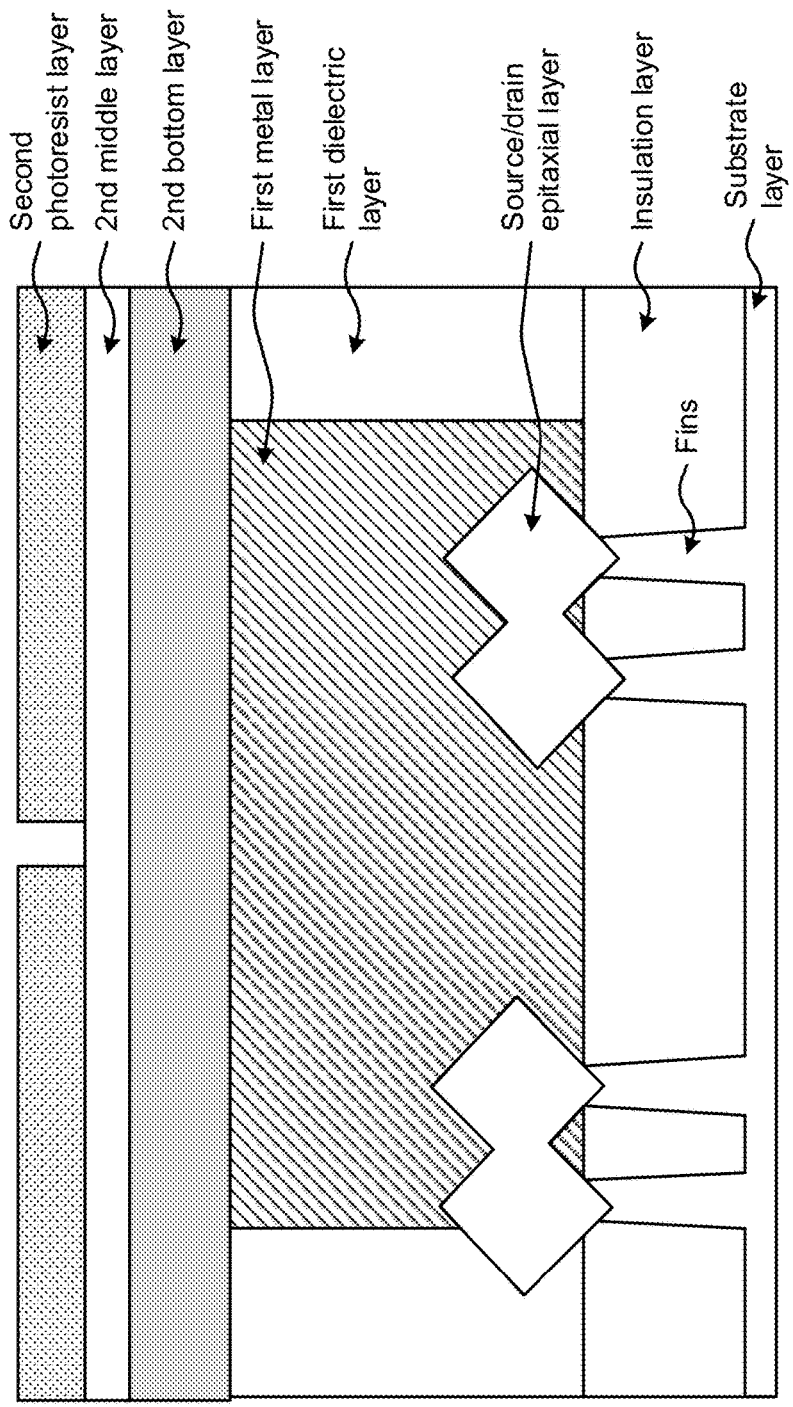

As shown in FIG. 2G, and by reference number 235, a second bottom layer may be formed on top of the first metal layer and the first dielectric layer, a second middle layer may be formed on top of the second bottom layer, and a second photoresist layer may be formed on portions of the second middle layer. The second bottom layer may include an organic material, such as carbon, oxygen, hydrogen, a thermosetting polyarene ether, and/or the like. The second middle layer may include an ARC material, such as silicon, oxygen, nitrogen, silicon oxide, a silicon-containing ARC material, and/or the like. The second photoresist layer may include a photoresist material, such as a photopolymeric photoresist, a photodecomposing photoresist, a photocrosslinking photoresist, and/or the like. In some implementations, the second photoresist layer is patterned on the portions of the second middle layer so that a gap may be formed in the first metal layer, as described below. In some implementations, the photoresist tool of the tool configuration, described above in connection with FIG. 1, may be utilized to form the second bottom layer on top of the first metal layer and the first dielectric layer, to form the second middle layer on top of the second bottom layer, and to form the second photoresist layer on the portions of the second middle layer.

As shown in FIG. 2H, and by reference number 240, the second bottom layer, the second middle layer, the second photoresist layer may be removed and a portion of the first metal layer may be removed and transfer the pattern to form a gap in the first metal layer. For example, the first metal layer not formed below the second photoresist layer may be removed to form the gap in the first metal layer. In some implementations, one or more photolithography and/or etching operations may be performed to an etch on the second bottom layer, the second middle layer, and the second photoresist layer and to form the gap in the first metal layer. For example, one or more photolithographic operations may be performed to remove portions of the second bottom layer and the second middle layer not formed under the second photoresist layer. One or more etching operations may be performed to remove remaining portions of the second bottom layer, the second middle layer, and the second photoresist layer from the semiconductor device.

In some implementations, one or more etching operations may be performed to remove the first metal layer not formed below the second photoresist layer and to form the gap in the first metal layer. For example, when the first metal layer is made from cobalt, a dry etching operation, utilizing chlorine and hydrogen gases, chlorine and oxygen gases, and/or the like, may be performed to remove the first metal layer not formed below the second photoresist layer and to form the gap in the first metal layer. In another example, when the first metal layer is made from tungsten, a dry etching operation, utilizing carbon tetrafluoride gas, nitrogen trifluoride gas, sulfur hexafluoride gas, and/or the like, may be performed to remove the first metal layer not formed below the second photoresist layer and to form the gap in the first metal layer. In some implementations, the photoresist tool and/or the etch tool of the tool configuration, described above in connection with FIG. 1, may be utilized to etch the second bottom layer, the second middle layer, the second photoresist layer, and/or the portion of the first metal layer that forms the gap in the first metal layer. In some implementations, the gap creates a first metal contact and a second metal contact, as shown in FIG. 2H. The first metal contact may electrically couple to the first source/drain plug, and the second metal contact may electrically couple to the second source/drain plug. In some implementations, the gap separates the first metal contact from the second metal contact by less than nineteen nanometers, such as a gap of approximately eight nanometers, a gap in a range from approximately eight nanometers to less than nineteen nanometers, and/or the like.

Figure 2I:
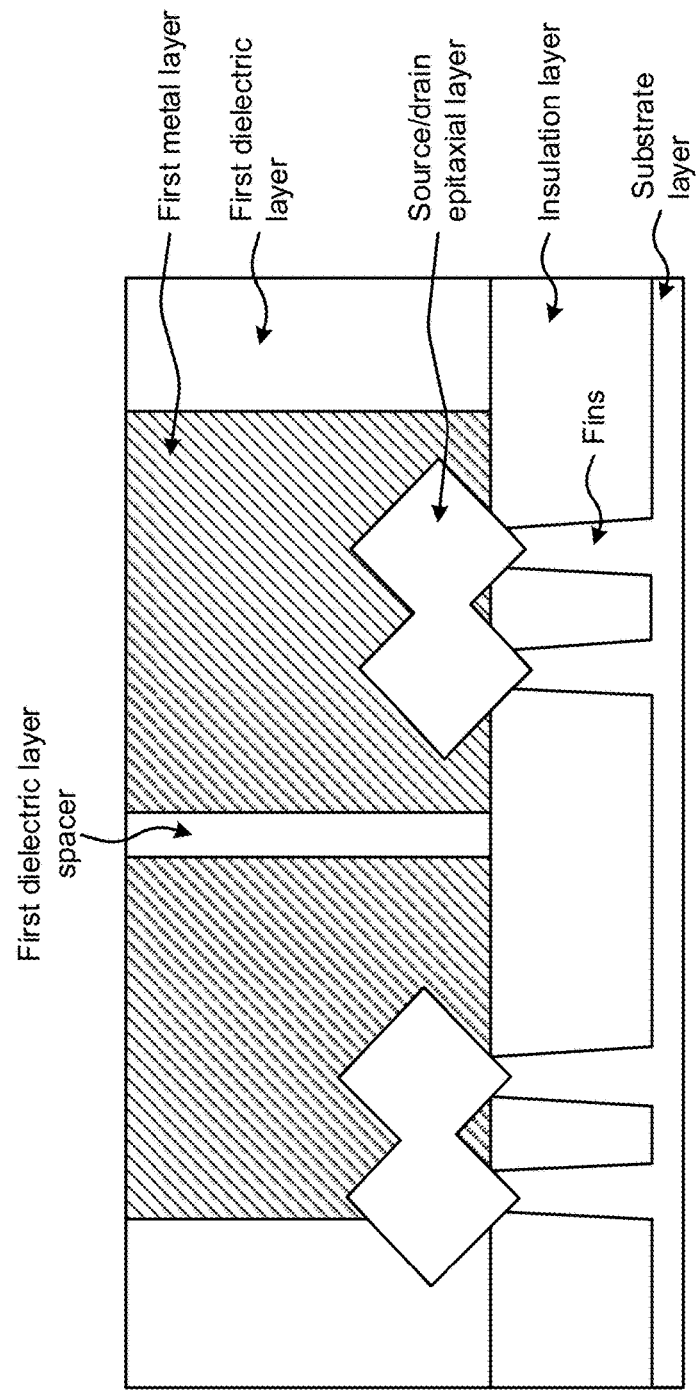

As shown in FIG. 2I, and by reference number 245, the gap in the first metal layer may be filled with material utilized for the first dielectric layer. For example, the gap may be filled with, silicon nitride, silicon oxide, a low-k material, and/or the like then with a CMP to planarize the surface. The dielectric material filled in the gap may electrically isolate the first metal contact from the second metal contact. In some implementations, the deposition tool of the tool configuration, described above in connection with FIG. 1, may be utilized to fill the gap in the first metal layer with the material utilized for the first dielectric layer.

Figure 2J:
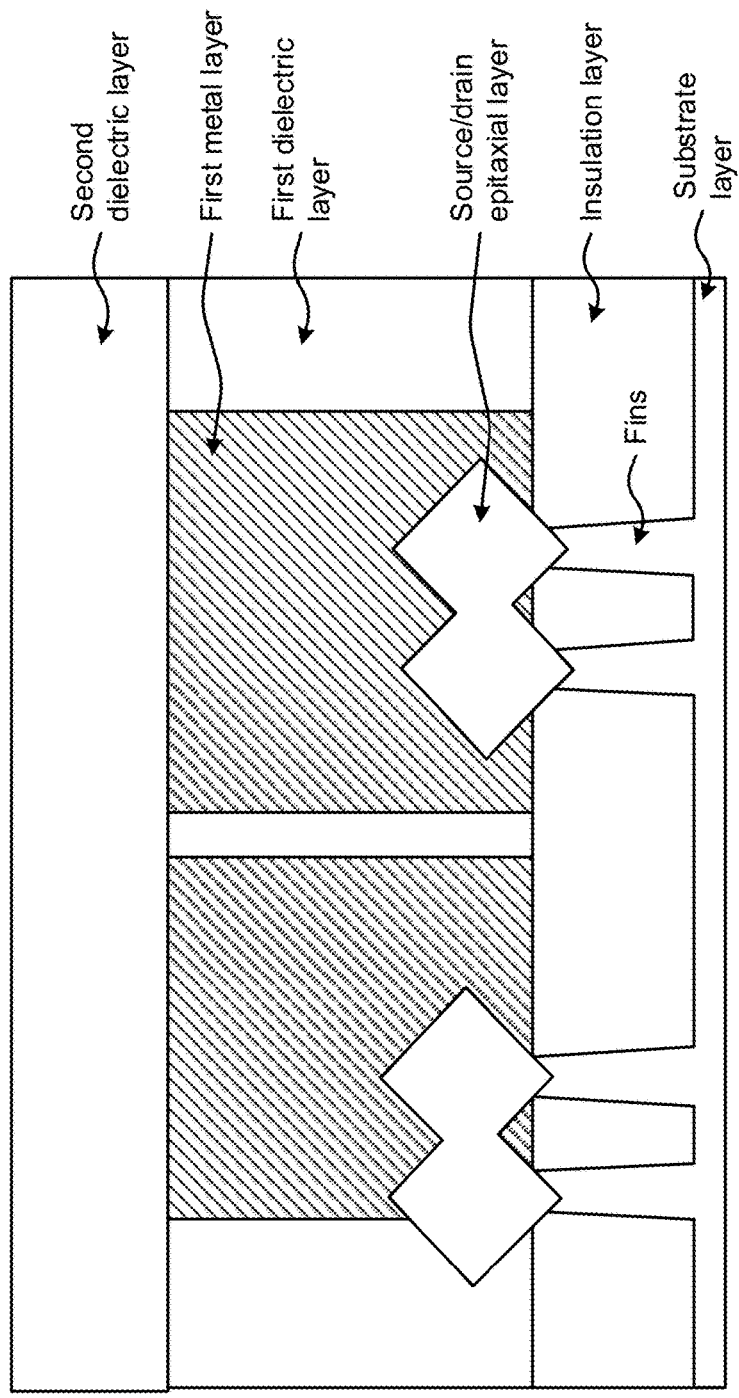

As shown in FIG. 2J, and by reference number 250, a second dielectric layer may be formed on the first metal layer (e.g., the first metal contact and the second metal contact) and the first dielectric layer. The second dielectric layer may include a material that electrically insulates the first metal layer and the first dielectric layer from other components of the semiconductor device. For example, the second dielectric layer may include, silicon nitride, silicon oxide, a low-k material, and/or the like. In some implementations, the deposition tool of the tool configuration, described above in connection with FIG. 1, may be utilized to form the second dielectric layer on the first metal layer and the first dielectric layer.

Figure 2K:
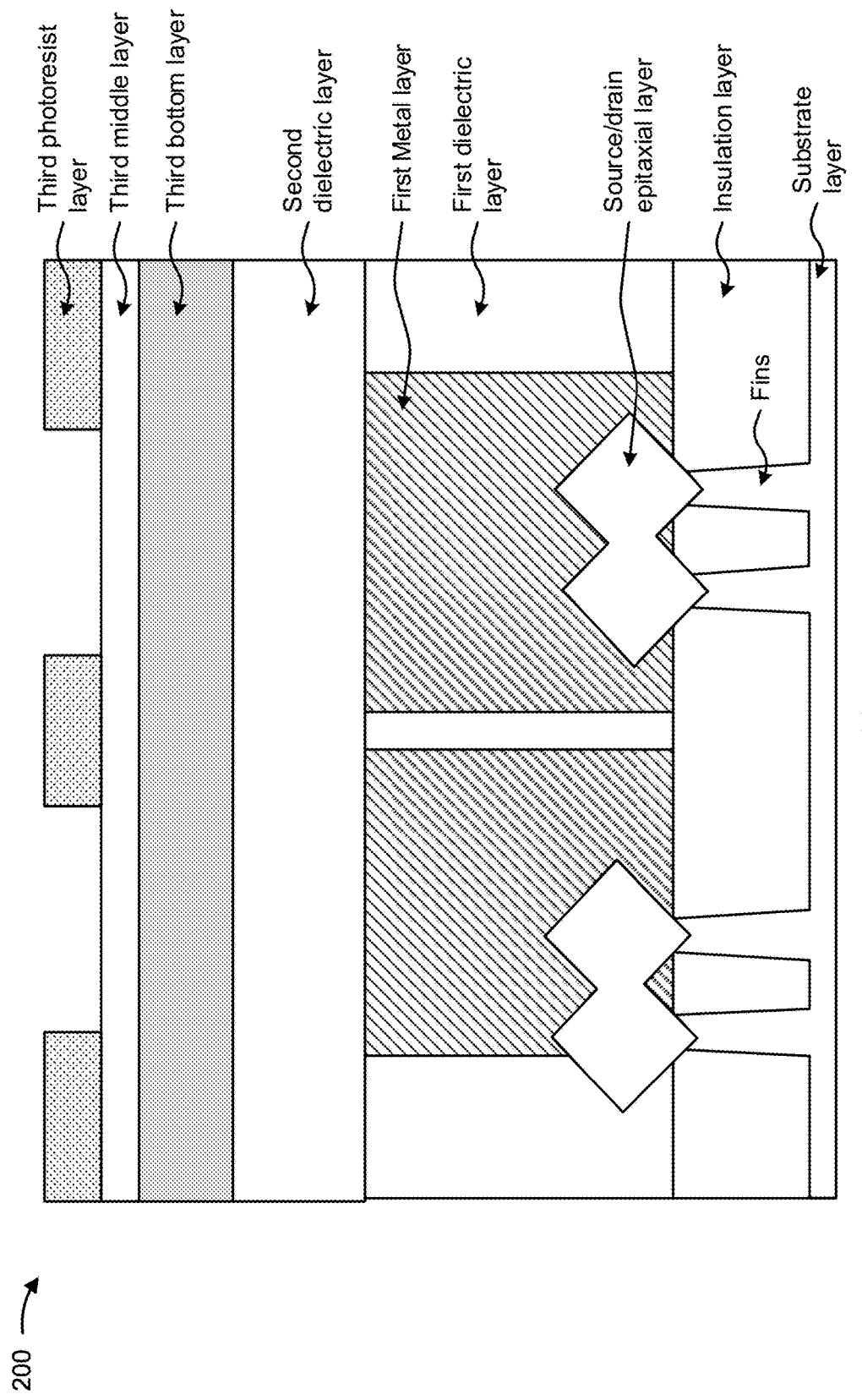

As shown in FIG. 2K, and by reference number 255, a third bottom layer may be formed on top of the second dielectric layer, a third middle layer may be formed on top of the third bottom layer, and a third photoresist layer may be formed on portions of the third middle layer. The third bottom layer may include an organic material, such as carbon, oxygen, hydrogen, a thermosetting polyarene ether, and/or the like. The third middle layer may include an ARC material, such as silicon, oxygen, nitrogen, silicon oxide, a silicon-containing ARC material, and/or the like. The third photoresist layer may include a photoresist material, such as a photopolymeric photoresist, a photodecomposing photoresist, a photocrosslinking photoresist, and/or the like. In some implementations, the third photoresist layer is patterned on the portions of the third middle layer so that vias may be formed in the second dielectric layer, as described below. In some implementations, the photoresist tool of the tool configuration, described above in connection with FIG. 1, may be utilized to form the third bottom layer on top of the second dielectric layer, to form the third middle layer on top of the third bottom layer, and to form the third photoresist layer on the portions of the third middle layer.

Figure 2L:
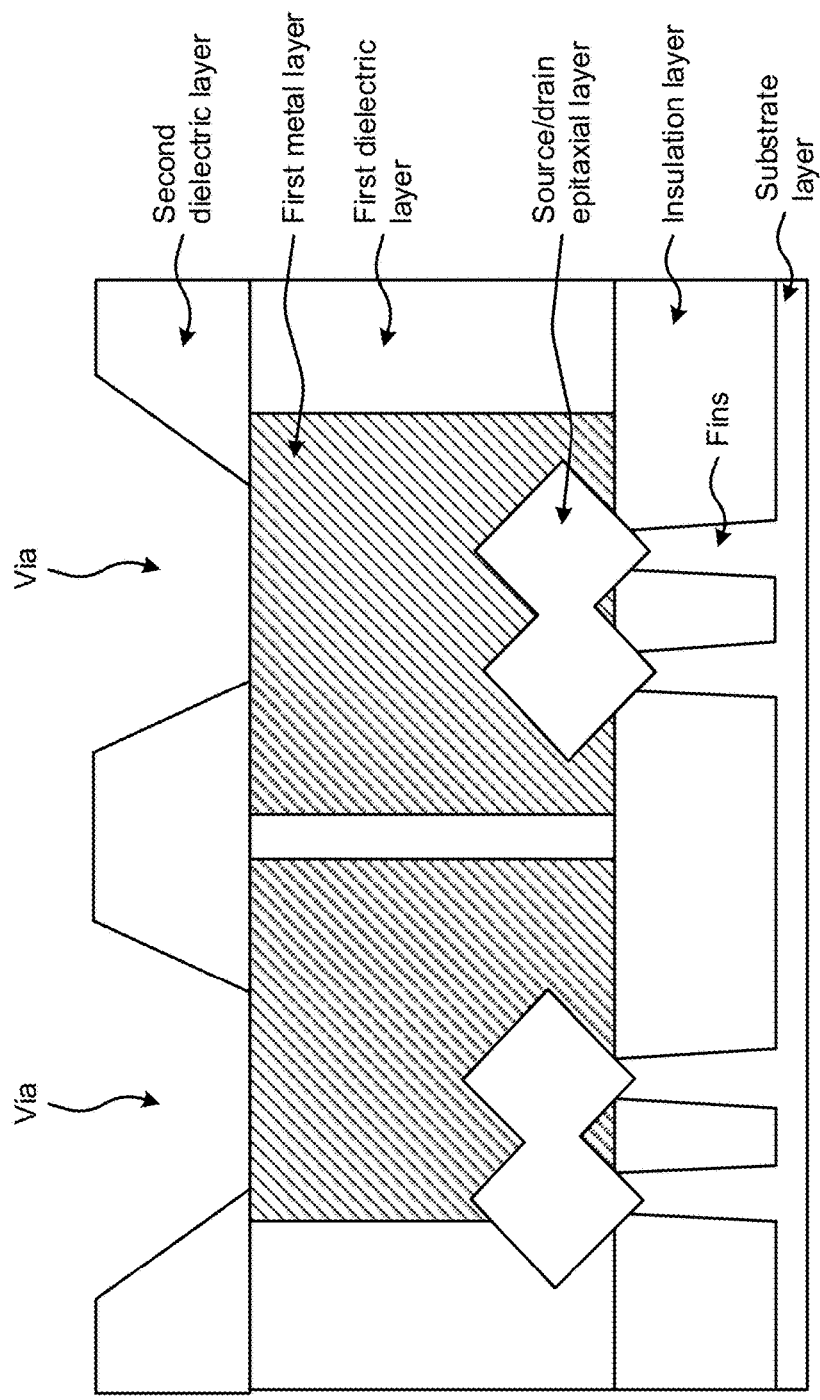

As shown in FIG. 2L, and by reference number 260, the third bottom layer, the third middle layer, and the third photoresist layer may be etched and the pattern transferred to the second dielectric layer and portions of the second dielectric layer may be removed to form vias in the second dielectric layer based on the formation of the third photoresist layer on the portions of the third middle layer. In some implementations, one or more photolithography and/or etching operations may be performed to remove the third bottom layer, the third middle layer, and the third photoresist layer and to form the vias in the second dielectric layer. For example, one or more photolithographic operations may be performed to remove portions of the third bottom layer and the third middle layer not formed under the third photoresist layer. One or more etching operations may be performed to remove remaining portions of the third bottom layer, the third middle layer, and the third photoresist layer from the semiconductor device.

In some implementations, one or more etching operations may be performed to remove the second dielectric layer not formed below the third photoresist layer and to form the vias in the second dielectric layer. For example, a dry etching operation, utilizing chlorine and hydrogen gases, chlorine and oxygen gases, carbon tetrafluoride gas, nitrogen trifluoride gas, sulfur hexafluoride gas, and/or the like, may be performed to remove the second dielectric layer not formed below the third photoresist layer and to form the vias in the second dielectric layer. In some implementations, the photoresist tool and/or the etch tool of the tool configuration, described above in connection with FIG. 1, may be utilized to remove the third bottom layer, the third middle layer, and the third photoresist layer and to form the vias in the second dielectric layer.

Figure 2M:
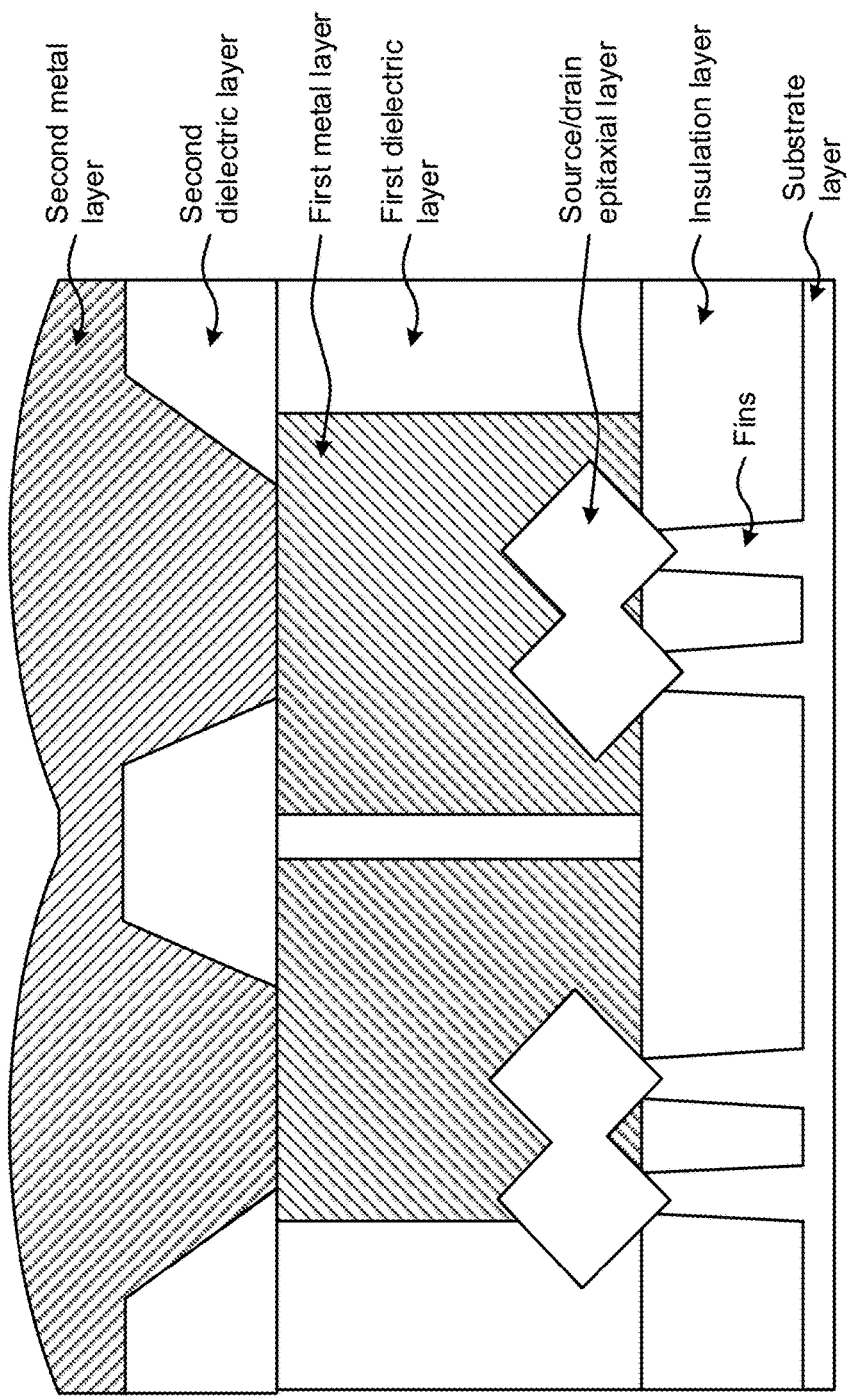

As shown in FIG. 2M, and by reference number 265, a second metal layer may be formed on the second dielectric layer to fill the vias in the second dielectric layer with the second metal layer and so that the second metal layer contacts portions of the first metal layer (e.g., the first metal contact and the second metal contact). The second metal layer may include a metal, such as cobalt, tungsten, aluminum, copper, and/or the like. In some implementations, a metal deposition operation may be performed to form the second metal layer on the second dielectric layer and to fill the vias in the second dielectric layer with the second metal layer. For example, PVD, CVD, ALD, MBE, ECD, and/or the like may be performed to form the second metal layer on the second dielectric layer and to fill the vias in the second dielectric layer with the second metal layer. In some implementations, the deposition tool and/or the metal tool of the tool configuration, described above in connection with FIG. 1, may be utilized to form the second metal layer on the second dielectric layer and to fill the vias in the second dielectric layer with the second metal layer.

As shown in FIG. 2N, and by reference number 270, the second metal layer may be polished to be substantially planar with the second dielectric layer. In some implementations, a CMP operation may be performed to polish the second metal layer to be substantially planar with the second dielectric layer. In some implementations, the CMP tool of the tool configuration, described above in connection with FIG. 1, may be utilized to polish the second metal layer to be substantially planar with the second dielectric layer. As further shown in FIG. 2N, the second metal layer formed in the vias of the second dielectric layer may form a third metal contact and a fourth metal contact. In some implementations, the third metal contact electrically couples to the first metal contact, and the fourth metal contact electrically couples to the second metal contact.

In this way, the method for manufacturing a semiconductor device, described in connection with FIGS. 2A-2N, enables metal contacts electrically coupled to corresponding metal-to-source/drain plugs of the semiconductor device to be separated by less than nineteen nanometers, in range from approximately eight nanometers to less than nineteen nanometers, and/or the like. Thus, the method may be utilized for the semiconductor designs that indicate that metal contacts are to be separated by less than nineteen nanometers. Furthermore, the method provides a more of an interface between a source/drain and the corresponding metal-to-source/drain plugs (e.g., relative to the island patterning technique), which reduces resistance of the corresponding metal-to-source/drain plugs (e.g., relative to the island patterning technique).

As indicated above, FIGS. 2A-2N are provided merely as one or more examples. Other examples may differ from what is described with regard to FIGS. 2A-2N.

Figure 3A:
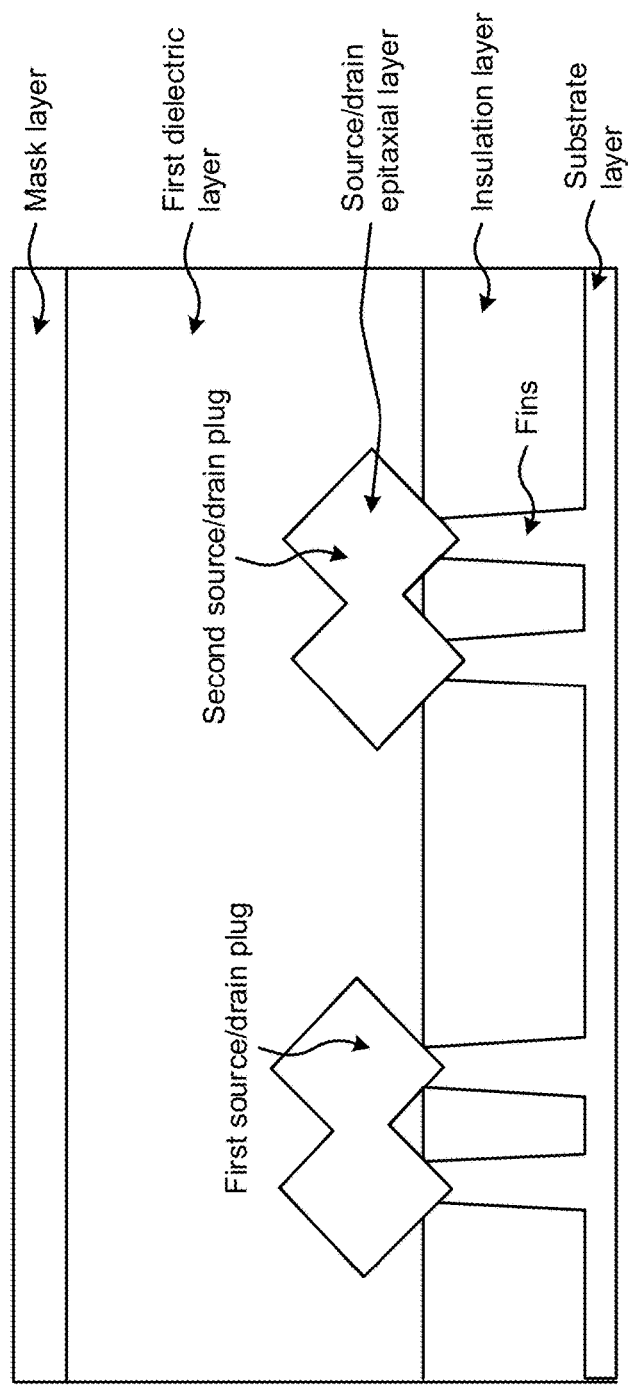
FIGS. 3A-3P are diagrams of another one or more example operations involved in manufacturing the example semiconductor device described herein.
Figure 3B:
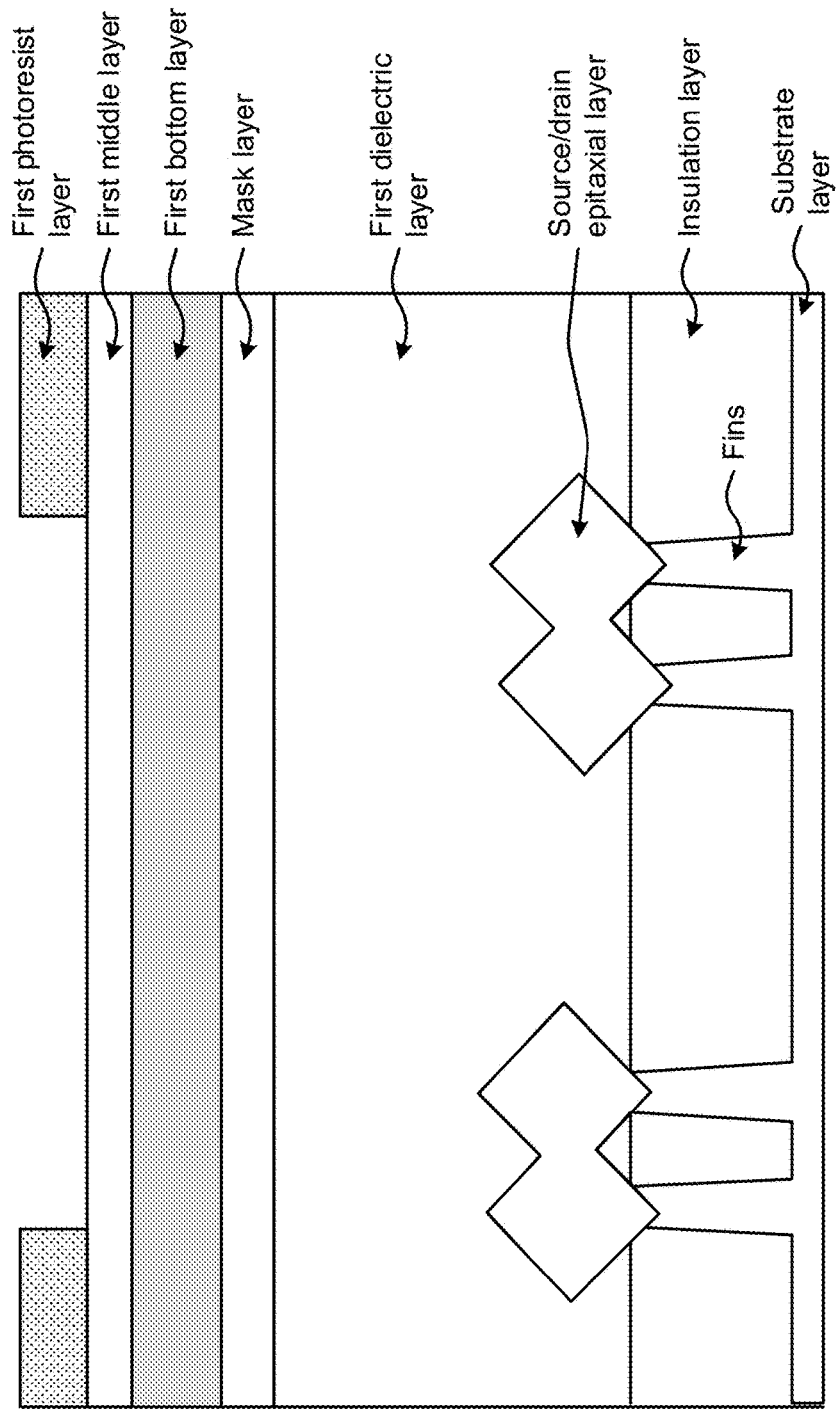
Figure 3E:
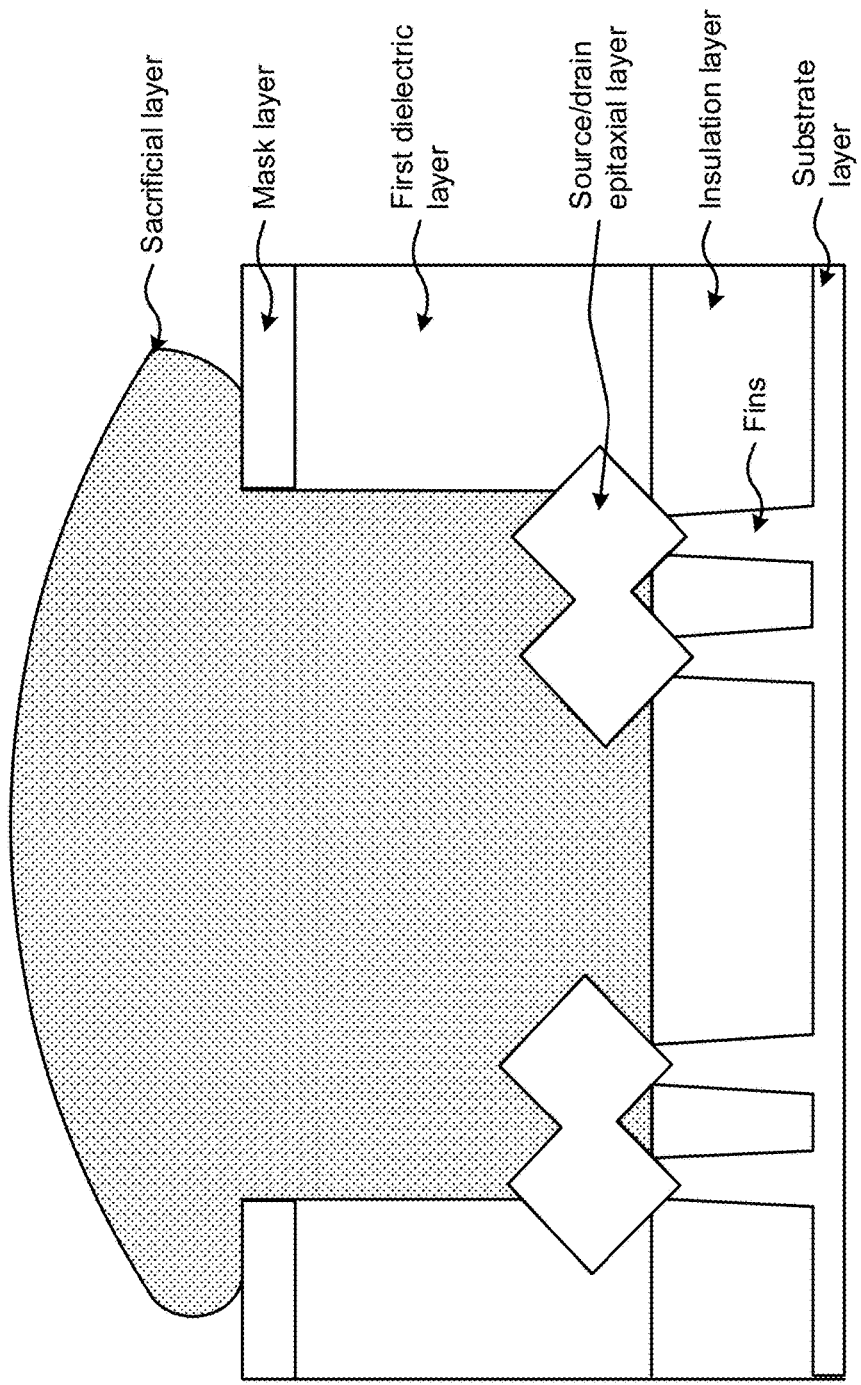
Figure 3F:
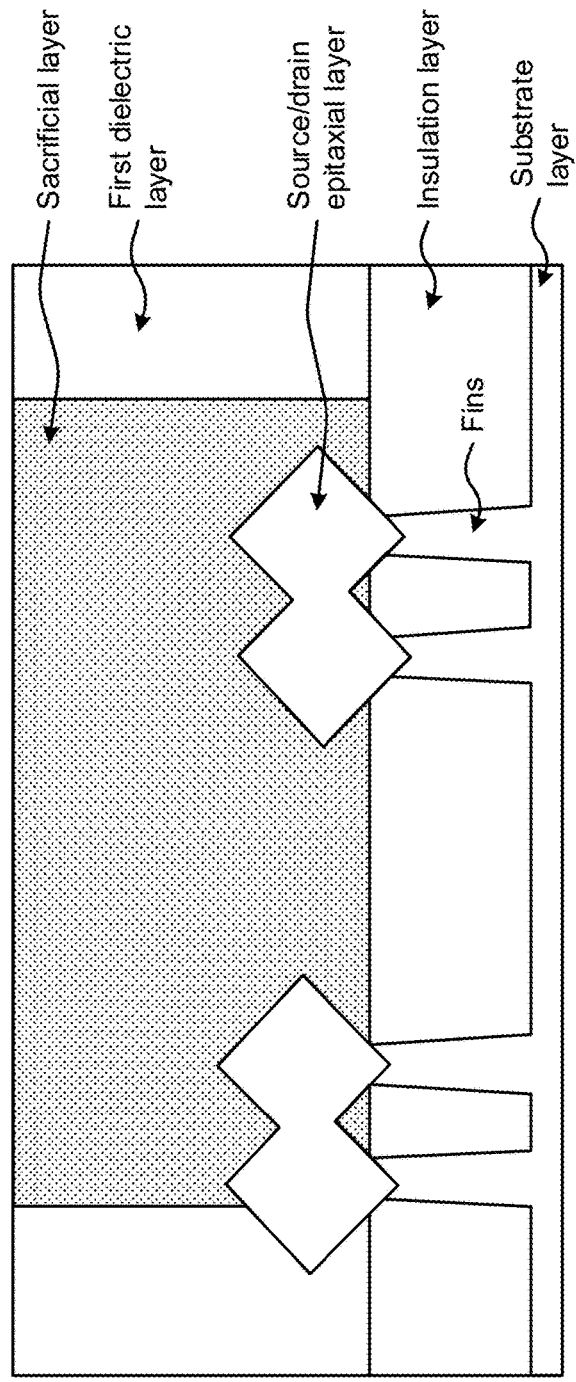
Figure 3G:
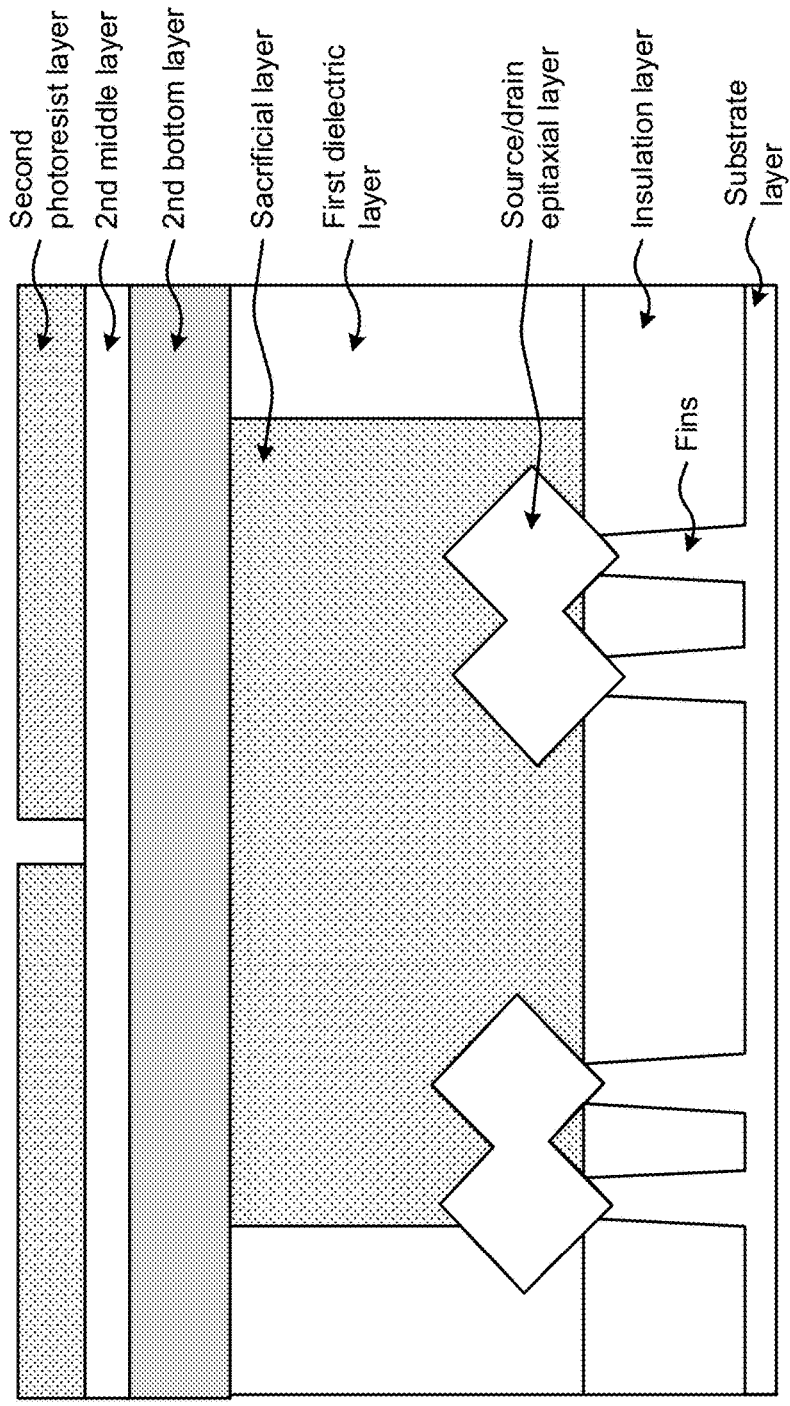
Figure 3H:
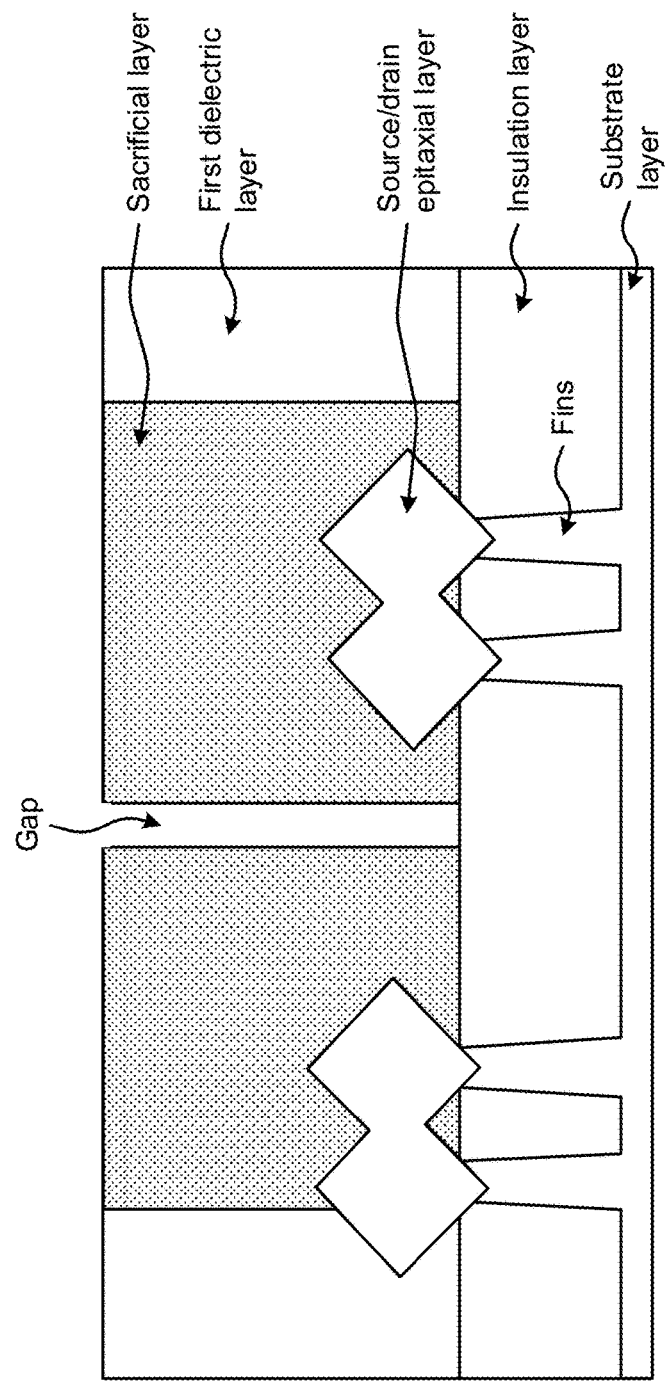
Figure 3J:
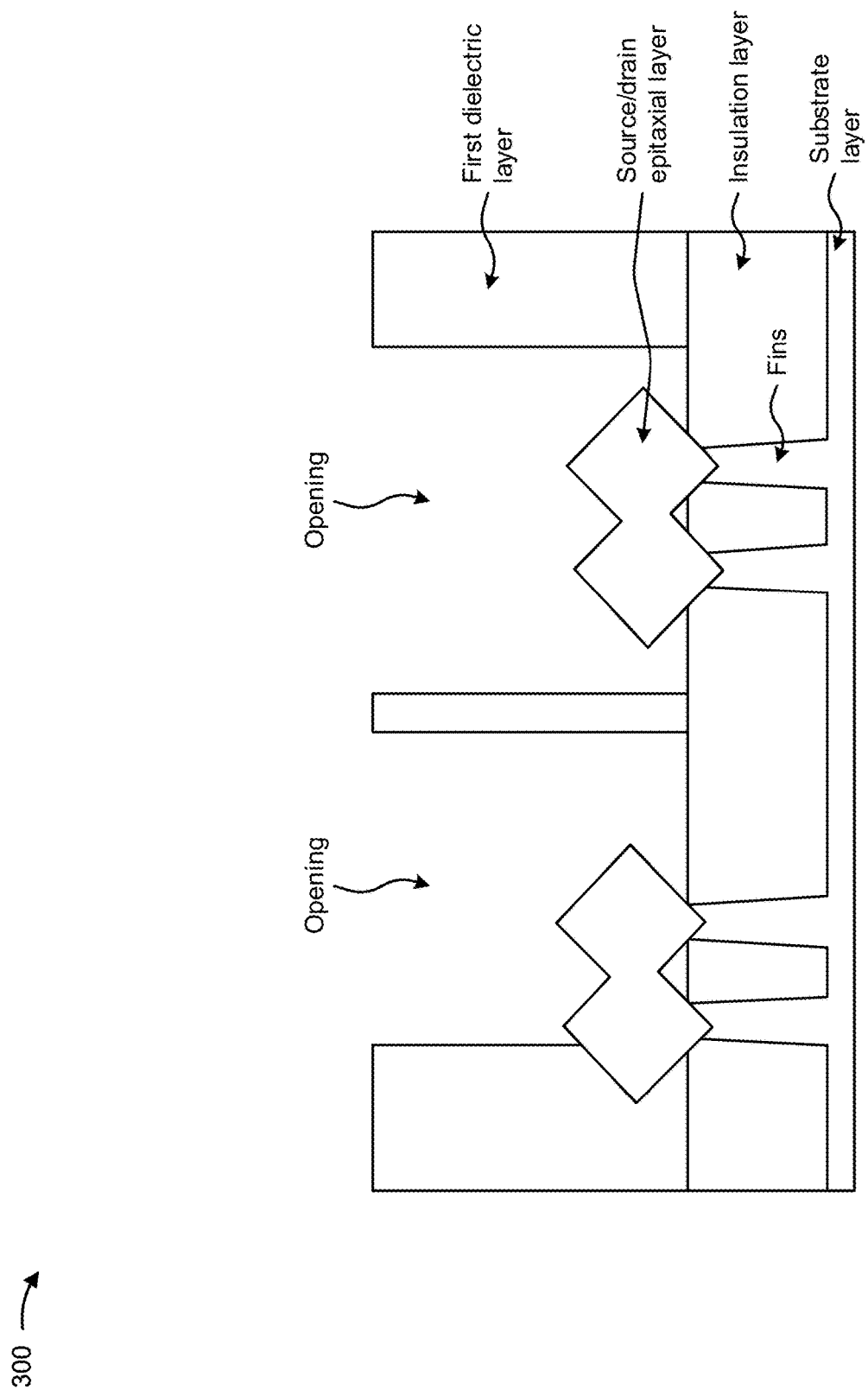
Figure 3L:
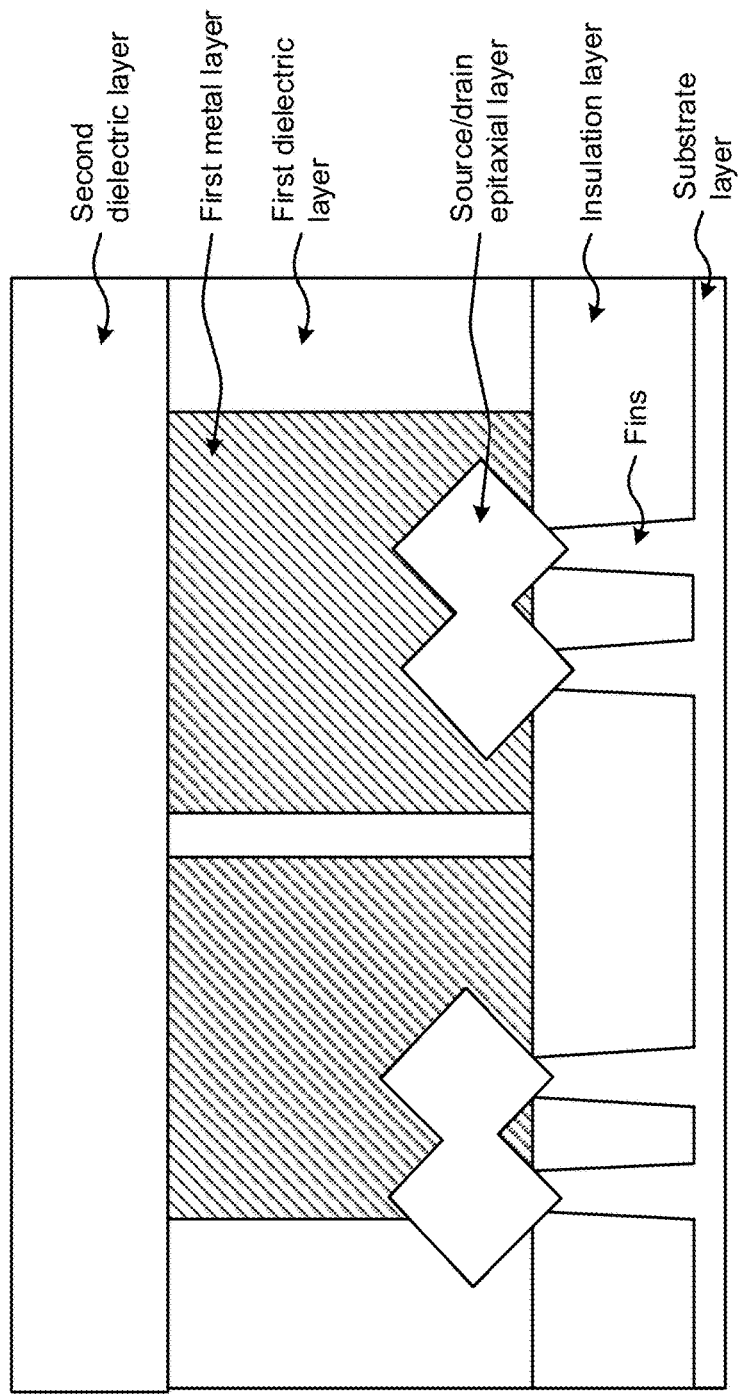
Figure 3M:
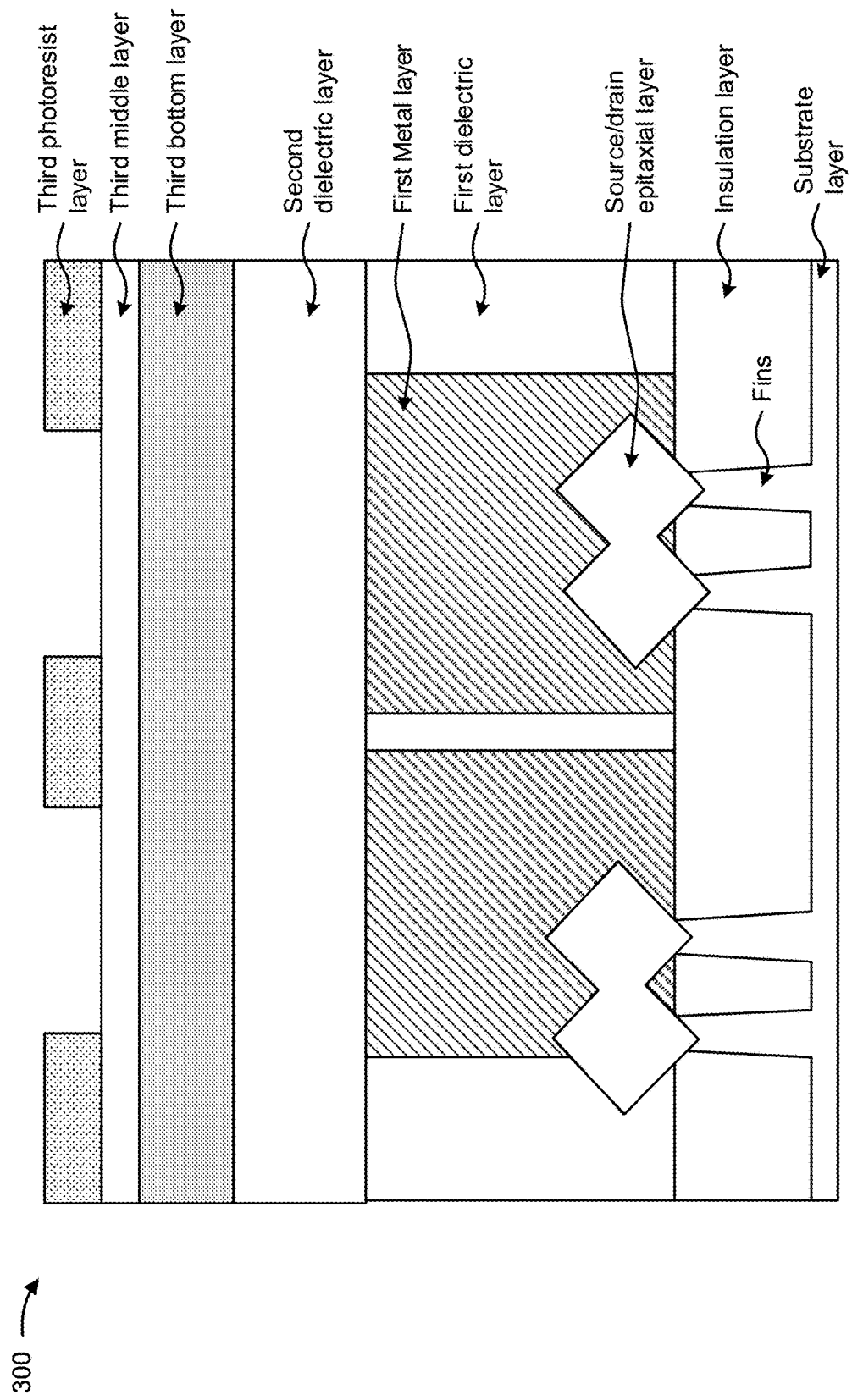
Figure 3N:
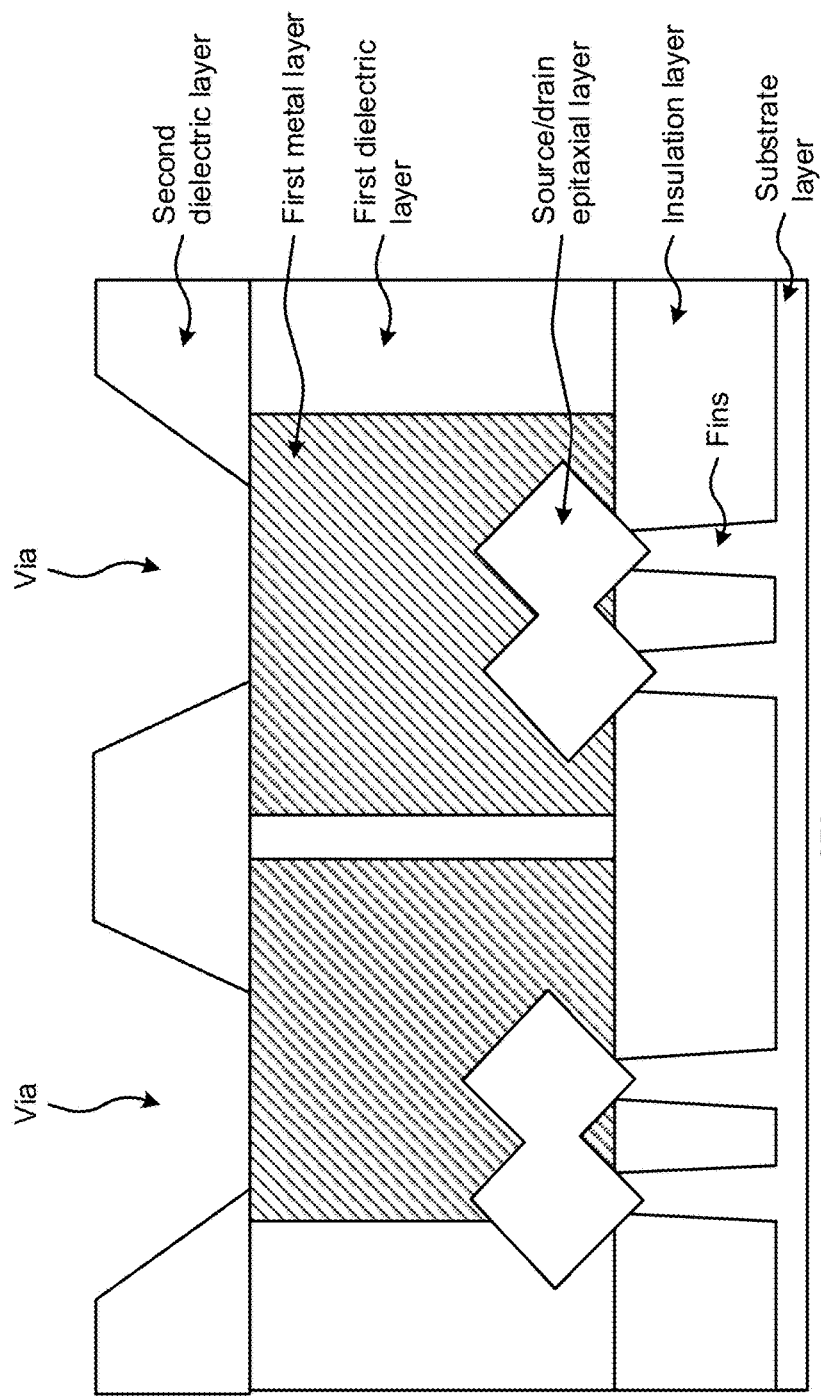
Figure 3O:
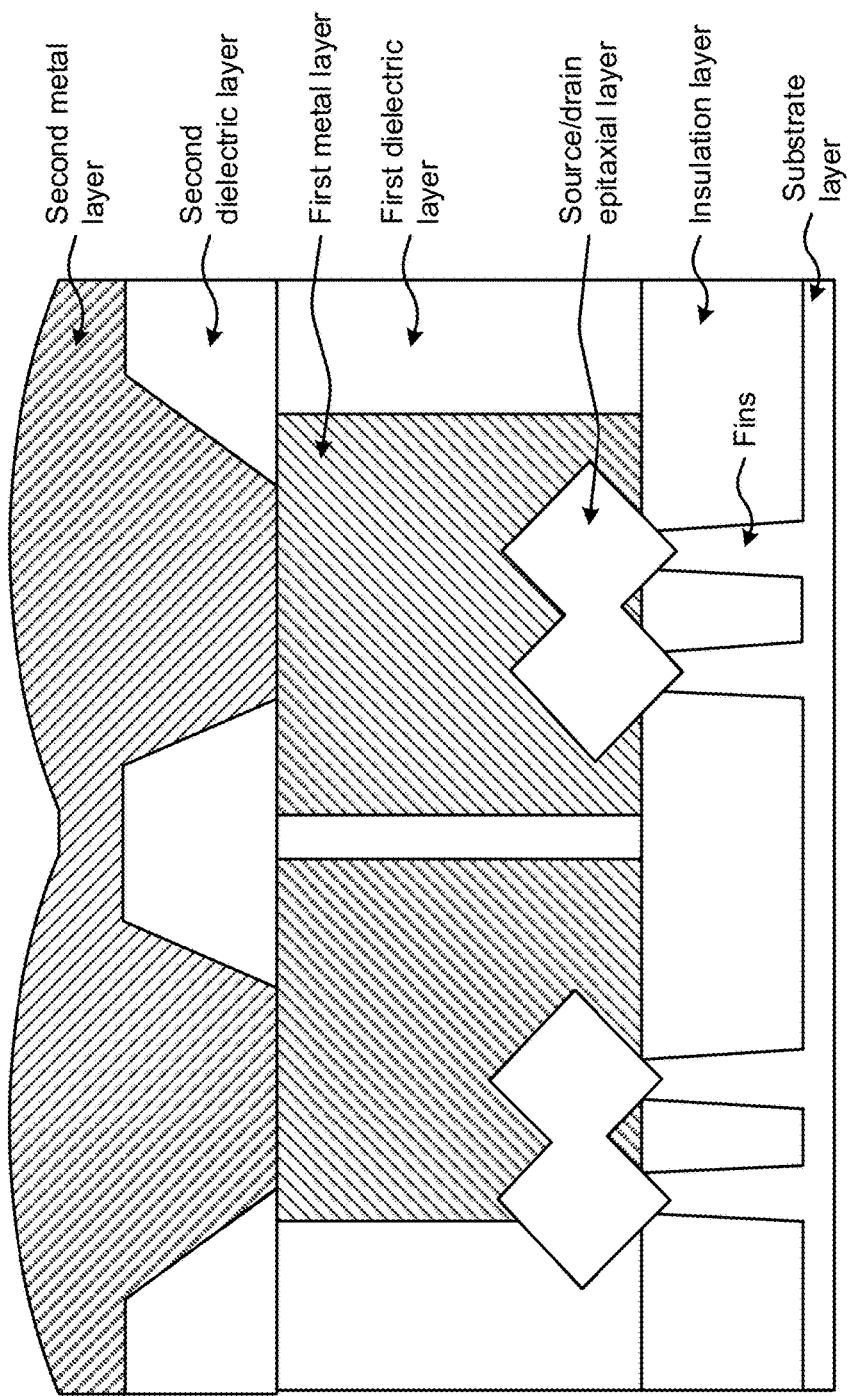
Figure 3P:
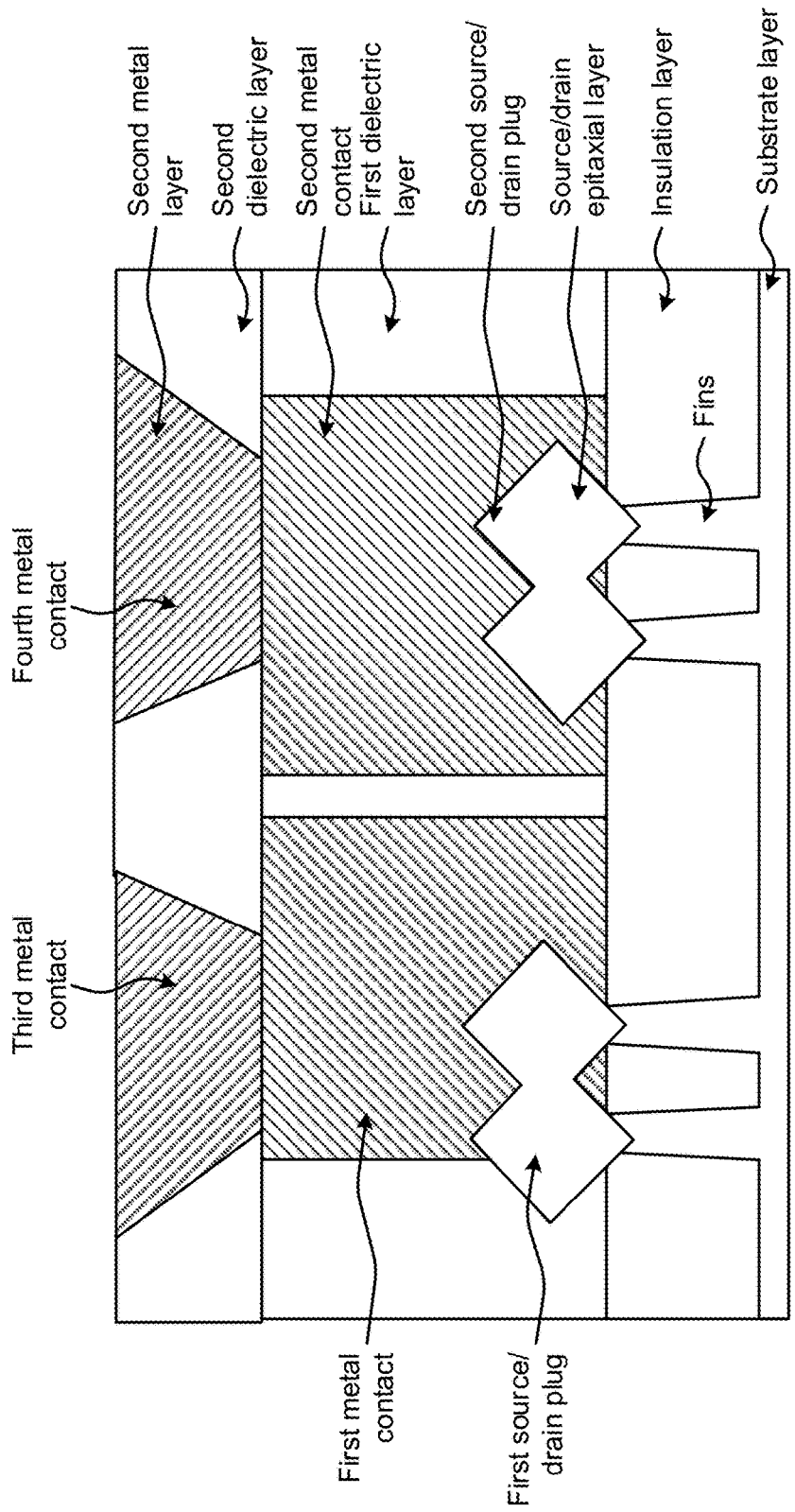

FIGS. 3A-3P are diagrams of one or more example operations 300 involved in manufacturing an example semiconductor device (e.g., a logic device, a memory device, a finFET, a MOSFET, and/or the like). As shown in FIG. 3A, the semiconductor device may include a substrate layer with multiple fins, an insulation layer, a source/drain epitaxial layer, and a first dielectric layer. The substrate layer, the multiple fins, the insulation layer, the source/drain epitaxial layer (e.g., the first source/drain plug and the second source/drain plug), and the first dielectric layer of FIG. 3A may include the features described above in connection with FIG. 2A.

As further shown in FIG. 3A, and by reference number 305, a mask layer may be formed on the semiconductor device. For example, the mask layer may be formed on top of the first dielectric layer of the semiconductor device. The mask layer may include a metal oxide, titanium nitride, tungsten carbide, and/or the like. In some implementations, the deposition tool and/or the metal tool of the tool configuration, described above in connection with FIG. 1, may be utilized to form the mask layer on top of the first dielectric layer.

As shown in FIG. 3B, and by reference number 310, a first bottom layer may be formed on top of the mask layer, a first middle layer may be formed on top of the first bottom layer, and a first photoresist layer may be formed on portions of the first middle layer. The first bottom layer may include an organic material, such as carbon, oxygen, hydrogen, a thermosetting polyarene ether, and/or the like. The first middle layer may include an ARC material, such as silicon, oxygen, nitrogen, silicon oxide, a silicon-containing ARC material, and/or the like. The first photoresist layer may include a photoresist material, such as a photopolymeric photoresist, a photodecomposing photoresist, a photocrosslinking photoresist, and/or the like. In some implementations, the photoresist layer is patterned on the portions of the first middle layer so that an opening may be formed to expose the first source/drain plug and the second source/drain plug, as described below. In some implementations, the photoresist tool of the tool configuration, described above in connection with FIG. 1, may be utilized to form the first bottom layer on top of the mask layer, to form the first middle layer on top of the first bottom layer, and to form the first photoresist layer on the portions of the first middle layer.

As shown in FIG. 3C, and by reference number 315, the first bottom layer, the first middle layer, the first photoresist layer, and a portion of the mask layer may be removed based on formation of the first photoresist layer on the portions of the first middle layer. Such removal may cause portions of the mask layer to remain on top of the first dielectric layer, as shown in FIG. 3C. In some implementations, one or more photolithography and/or etching operations may be performed to remove the first bottom layer, the first middle layer, the first photoresist layer, and the portion of the mask layer. For example, one or more photolithographic operations may be performed to remove portions of the first bottom layer, the first middle layer, and the mask layer not formed under the first photoresist layer. One or more etching operations may be performed to remove remaining portions of the first bottom layer, the first middle layer, and the first photoresist layer from the semiconductor device. For example, a dry etching operation may be performed, utilizing carbon tetrafluoride gas, a $CF_3H$ gas, and/or the like to etch the first middle layer; $SO_2$, $O_2$ gas, and/or the like to etch the first bottom layer; carbon tetrafluoride gas, $C_4F_6$ gas, and/or the like to etch first mask layer, after the first photoresist pattern is transferred to the first mask layer. In some implementations, the photoresist tool and/or the etch tool of the tool configuration, described above in connection with FIG. 1, may be utilized to remove the first bottom layer, the first middle layer, the first photoresist layer, and the portion of the mask layer based on formation of the first photoresist layer on the portions of the first middle layer.

As shown in FIG. 3D, and by reference number 320, the first dielectric layer not formed below the portion of the mask layer may be removed to form an opening that exposes the source/drain epitaxial layer (e.g., the first source/drain plug and the second source/drain plug). In some implementations, one or more etching operations may be performed to remove the first dielectric layer not formed below the portion of the mask layer and to form the opening that exposes the source/drain epitaxial layer. For example, a dry etching operation, utilizing carbon tetrafluoride gas, hexafluorocyclobutane gas, octafluorocyclobutane gas, oxygen gas, and/or the like, may be performed to remove the first dielectric layer not formed below the portion of the mask layer and to form the opening that exposes the source/drain epitaxial layer. In some implementations, the etch tool of the tool configuration, described above in connection with FIG. 1, may be utilized to remove the first dielectric layer not formed below the portion of the mask layer and to form the opening that exposes the source/drain epitaxial layer.

As shown in FIG. 3E, and by reference number 325, the opening in the first dielectric layer and the mask layer may be filled with a sacrificial layer that covers the source/drain epitaxial layer (e.g., the first source/drain plug and the second source/drain plug). The sacrificial layer may include material that is subsequently removed from the semiconductor device, such as silicon, silicon nitride, hafnium oxide, and/or the like. In some implementations, a deposition operation may be performed to fill the opening in the first dielectric layer and the mask layer with the sacrificial layer that covers the source/drain epitaxial layer. For example, PVD, CVD, ALD, MBE, ECD, and/or the like may be performed to fill the opening in the first dielectric layer and the mask layer with the sacrificial layer that covers the source/drain epitaxial layer. In some implementations, the deposition tool of the tool configuration, described above in connection with FIG. 1, may be utilized to fill the opening in the first dielectric layer and the mask layer with the sacrificial layer that covers the source/drain epitaxial layer. If silicon is utilized for the sacrificial layer and the first dielectric layer, a liner layer (e.g., other than silicon) may be formed on walls and a bottom of the opening prior to the deposition of the sacrificial layer in the opening.

As shown in FIG. 3F, and by reference number 330, the sacrificial layer may be polished to be substantially planar with the first dielectric layer and to remove the mask layer. In some implementations, a CMP operation may be performed to polish the sacrificial layer to be substantially planar with the first dielectric layer and to remove the mask layer. In some implementations, the CMP tool of the tool configuration, described above in connection with FIG. 1, may be utilized to polish the sacrificial layer to be substantially planar with the first dielectric layer and to remove the mask layer.

As shown in FIG. 3G, and by reference number 335, a second bottom layer may be formed on top of the sacrificial layer and the first dielectric layer, a second middle layer may be formed on top of the second bottom layer, and a second photoresist layer may be formed on portions of the second middle layer. The second bottom layer may include an organic material, such as carbon, oxygen, hydrogen, a thermosetting polyarene ether, and/or the like. The second middle layer may include an ARC material, such as silicon, oxygen, nitrogen, silicon oxide, a silicon-containing ARC material, and/or the like. The second photoresist layer may include a photoresist material, such as a photopolymeric photoresist, a photodecomposing photoresist, a photocrosslinking photoresist, and/or the like. In some implementations, the second photoresist layer is patterned on the portions of the second middle layer so that a gap may be formed in the sacrificial layer, as described below. In some implementations, the photoresist tool of the tool configuration, described above in connection with FIG. 1, may be utilized to form the second bottom layer on top of the sacrificial layer and the first dielectric layer, to form the second middle layer on top of the second bottom layer, and to form the second photoresist layer on the portions of the second middle layer.

As shown in FIG. 3H, and by reference number 340, the second bottom layer, the second middle layer, and the second photoresist layer may be removed and a portion of the sacrificial layer may be removed to form a gap in the sacrificial layer. For example, the sacrificial layer not formed below the second photoresist layer may be removed to form the gap in the sacrificial layer. In some implementations, one or more photolithography and/or etching operations may be performed to remove the second bottom layer, the second middle layer, and the second photoresist layer and to form the gap in the sacrificial layer. For example, one or more photolithographic operations may be performed to remove portions of the second bottom layer and the second middle layer not formed under the second photoresist layer. One or more etching operations may be performed to remove remaining portions of the second bottom layer, the second middle layer, and the second photoresist layer from the semiconductor device.

In some implementations, one or more etching operations may be performed to remove the sacrificial layer not formed below the second photoresist layer and to form the gap in the sacrificial layer. For example, a dry etching operation may be performed to remove the sacrificial layer not formed below the second photoresist layer and to form the gap in the sacrificial layer. In some implementations, the photoresist tool and/or the etch tool of the tool configuration, described above in connection with FIG. 1, may be utilized to remove the second bottom layer, the second middle layer, and the second photoresist layer and to form a gap in the sacrificial layer. In some implementations, the gap creates a spacer for a first metal contact and a second metal contact, as described below.

As shown in FIG. 3I, and by reference number 345, the gap in the sacrificial layer may be filled with material utilized for the first dielectric layer. For example, the gap may be filled with, silicon nitride, silicon oxide, and/or the like. The dielectric material filled in the gap may create a spacer that electrically isolates a first metal contact from a second metal contact, as described below. In some implementations, the deposition tool of the tool configuration, described above in connection with FIG. 1, may be utilized to fill the gap in the sacrificial layer with the material utilized for the first dielectric layer.

As shown in FIG. 3J, and by reference number 350, the sacrificial layer may be removed to form openings in the first dielectric layer that expose the source/drain epitaxial layer. In some implementations, one or more etching operations may be performed to remove the sacrificial layer and to form the openings in the first dielectric layer. For example, when the sacrificial layer is formed from silicon, a wet etching operation, utilizing ammonium hydroxide, may be performed to remove the sacrificial layer and to form the openings in the first dielectric layer. In another example, when the sacrificial layer is formed from silicon nitride, a wet etching operation, utilizing phosphoric acid, may be performed to remove the sacrificial layer and to form the openings in the first dielectric layer. In some implementations, the etch tool of the tool configuration, described above in connection with FIG. 1, may be utilized to remove the sacrificial layer and to form the openings in the first dielectric layer.

As shown in FIG. 3K, and by reference number 355, the openings in the first dielectric layer may be filled with a first metal layer. The first metal layer may include a metal, such as cobalt, tungsten, aluminum, copper, and/or the like. In some implementations, a metal deposition operation may be performed to fill the openings in the first dielectric layer with the first metal layer that covers the source/drain epitaxial layer. For example, PVD, CVD, ALD, MBE, ECD, and/or the like may be performed to fill the openings in the first dielectric layer with the first metal layer that covers the source/drain epitaxial layer. In some implementations, the deposition tool and/or the metal tool of the tool configuration, described above in connection with FIG. 1, may be utilized to fill the openings in the first dielectric layer with the first metal layer that covers the source/drain epitaxial layer. As further shown in FIG. 3K, the spacer with the first dielectric material layer may divide the first metal layer into a first metal contact and a second metal contact. The first metal contact may electrically couple to the first source/drain plug, and the second metal contact may electrically couple to the second source/drain plug. In some implementations, the spacer separates the first metal contact from the second metal contact by less than nineteen nanometers. In some implementations, the first metal layer provides more of an interface with the source/drain epitaxial layer (e.g., the first source/drain plug and second source/drain plug), relative to the island patterning technique, which reduces resistance between the first metal layer and the source/drain epitaxial layer, relative to the island patterning technique.

The first metal layer may be polished to be substantially planar with the first dielectric layer. In some implementations, a CMP operation may be performed to polish the first metal layer to be substantially planar with the first dielectric layer. In some implementations, the CMP tool of the tool configuration, described above in connection with FIG. 1, may be utilized to polish the first metal layer to be substantially planar with the first dielectric layer and to form the first metal contact and the second metal contact.

As shown in FIG. 3L, and by reference number 360, a second dielectric layer may be formed on the first metal layer (e.g., the first metal contact and the second metal contact) and the first dielectric layer. The second dielectric layer may include a material that electrically insulates the first metal layer and the first dielectric layer from other components of the semiconductor device. For example, the second dielectric layer may include, silicon nitride, silicon oxide, and/or the like. In some implementations, the deposition tool of the tool configuration, described above in connection with FIG. 1, may be utilized to form the second dielectric layer on the first metal layer and the first dielectric layer.

As shown in FIG. 3M, and by reference number 365, a third bottom layer may be formed on top of the second dielectric layer, a third middle layer may be formed on top of the third bottom layer, and a third photoresist layer may be formed on portions of the third middle layer. The third bottom layer may include an organic material, such as carbon, oxygen, hydrogen, a thermosetting polyarene ether, and/or the like. The third middle layer may include an ARC material, such as silicon, oxygen, nitrogen, silicon oxide, a silicon-containing ARC material, and/or the like. The third photoresist layer may include a photoresist material, such as a photopolymeric photoresist, a photodecomposing photoresist, a photocrosslinking photoresist, and/or the like. In some implementations, the third photoresist layer is patterned on the portions of the third middle layer so that vias may be formed in the second dielectric layer, as described below. In some implementations, the photoresist tool of the tool configuration, described above in connection with FIG. 1, may be utilized to form the third bottom layer on top of the second dielectric layer, to form the third middle layer on top of the third bottom layer, and to form the third photoresist layer on the portions of the third middle layer.

As shown in FIG. 3N, and by reference number 370, the third bottom layer, the third middle layer, and the third photoresist layer may be removed and portions of the second dielectric layer may be removed to form vias in the second dielectric layer based on the formation of the third photoresist layer on the portions of the third middle layer. In some implementations, one or more photolithography and/or etching operations may be performed to remove the third bottom layer, the third middle layer, and the third photoresist layer and to form the vias in the second dielectric layer. For example, one or more photolithographic operations may be performed to remove portions of the third bottom layer and the third middle layer not formed under the third photoresist layer. One or more etching operations may be performed to remove remaining portions of the third bottom layer, the third middle layer, and the third photoresist layer from the semiconductor device.

In some implementations, one or more etching operations may be performed to remove the second dielectric layer not formed below the third photoresist layer and to form the vias in the second dielectric layer. For example, a dry etching operation, utilizing chlorine and hydrogen gases, chlorine and oxygen gases, carbon tetrafluoride gas, nitrogen trifluoride gas, sulfur hexafluoride gas, and/or the like, may be performed to remove the second dielectric layer not formed below the third photoresist layer and to form the vias in the second dielectric layer. In some implementations, the photoresist tool and/or the etch tool of the tool configuration, described above in connection with FIG. 1, may be utilized to remove the third bottom layer, the third middle layer, and the third photoresist layer and to form the vias in the second dielectric layer.

As shown in FIG. 3O, and by reference number 375, a second metal layer may be formed on the second dielectric layer to fill the vias in the second dielectric layer with the second metal layer and so that the second metal layer contacts portions of the first metal layer (e.g., the first metal contact and the second metal contact). The second metal layer may include a metal, such as cobalt, tungsten, aluminum, copper, and/or the like. In some implementations, a metal deposition operation may be performed to form the second metal layer on the second dielectric layer and to fill the vias in the second dielectric layer with the second metal layer. For example, PVD, CVD, ALD, MBE, ECD, and/or the like may be performed to form the second metal layer on the second dielectric layer and to fill the vias in the second dielectric layer with the second metal layer. In some implementations, the deposition tool and/or the metal tool of the tool configuration, described above in connection with FIG. 1, may be utilized to form the second metal layer on the second dielectric layer and to fill the vias in the second dielectric layer with the second metal layer.

As shown in FIG. 3P, and by reference number 380, the second metal layer may be polished to be substantially planar with the second dielectric layer. In some implementations, a CMP operation may be performed to polish the second metal layer to be substantially planar with the second dielectric layer. In some implementations, the CMP tool of the tool configuration, described above in connection with FIG. 1, may be utilized to polish the second metal layer to be substantially planar with the second dielectric layer. As further shown in FIG. 3P, the second metal layer formed in the vias of the second dielectric layer may form a third metal contact and a fourth metal contact. In some implementations, the third metal contact electrically couples to the first metal contact, and the fourth metal contact electrically couples to the second metal contact.

In this way, the method for manufacturing a semiconductor device, described in connection with FIGS. 3A-3P, enables metal contacts electrically coupled to corresponding metal-to-source/drain plugs of the semiconductor device to be separated by less than nineteen nanometers, in a range from approximately eight nanometers to less than nineteen nanometers, and/or the like. Thus, the method may be utilized for the semiconductor designs that indicate that metal contacts are to be separated by less than nineteen nanometers. Furthermore, the method provides a better interface between the metal contacts and the corresponding metal-to-source/drain plugs (e.g., relative to the island patterning technique), which reduces resistance between the metal contacts and the corresponding metal-to-source/drain plugs (e.g., relative to the island patterning technique).

As indicated above, FIGS. 3A-3P are provided merely as one or more examples. Other examples may differ from what is described with regard to FIGS. 3A-3P.

Figure 4:
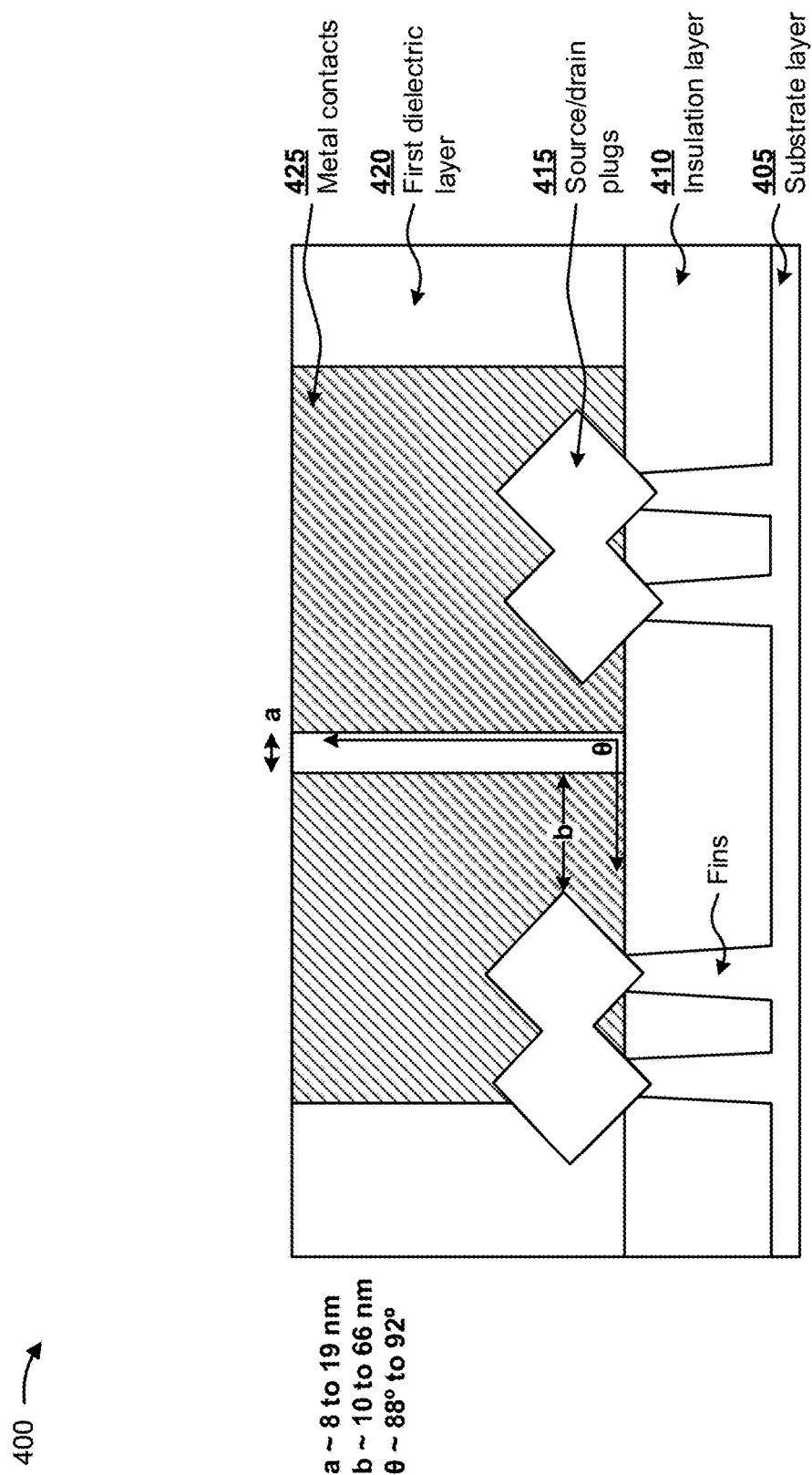
FIG. 4 is a diagram of the example semiconductor device described herein.

FIG. 4 is a diagram of an example semiconductor device 400 described herein. As shown, semiconductor device 400 may include a substrate layer 405 with multiple fins, an insulation layer 410, source/drain plugs 415, a first dielectric layer 420, and metal contacts 425. Substrate layer 405, the multiple fins, insulation layer 410, and first dielectric layer 420 may correspond to the substrate layer, the multiple fins, the insulation layer, and the first dielectric layer described above in connection with FIGS. 2A-3P. Source/drain plugs 415 may correspond to the first source/drain plug and the second source/drain plug described above in connection with FIGS. 2A-3P. Metal contacts 425 may correspond to the first metal contact and the second metal contact described above in connection with FIGS. 2A-3P. Semiconductor device 400 may be formed using the method of FIGS. 2A-2N or the method of FIGS. 3A-3P.

As further shown in FIG. 4, metal contacts 425 may be spaced apart by a distance (a) in a range from approximately eight (8) nanometers to less than nineteen (19) nanometers. In some implementations, the distance (a) may be approximately eight (8) nanometers. In some implementations, using this type of process for patterning may provide a distance (a) of more than nineteen (19) nanometers. A sidewall of one of metal contacts 425 may be spaced from a corresponding one of source/drain plugs 415 by a distance (b) in a range from approximately ten (10) nanometers to approximately sixty-six (66) nanometers. In some implementations, as shown in FIG. 4, the distance (b) may be less than ten (10) nanometers even with isolation material over the edge of the source/drain epitaxial layer. An angle (θ) formed based on a sidewall of one of metal contacts 425 and based on a top surface of insulation layer 410 may be in a range from approximately eighty-eight (88) degrees to approximately ninety-two (92) degrees. In contrast, with the island patterning technique, the distance (a) may be greater than nineteen (19) nanometers, the distance (b) may be in a range from approximately ten (10) nanometers to approximately fifty (50) nanometers, the angle (θ) may be in a range from approximately eighty-five (85) degrees to approximately eighty-eight (88) degrees. In this way, the dimensions of semiconductor device 400 enables metal contacts 425 electrically coupled to corresponding source/drain 415 of semiconductor device 400 to be separated by less than nineteen nanometers. Thus, semiconductor device 400 may be utilized for semiconductor designs that indicate that metal contacts are to be separated by less than nineteen nanometers. Furthermore, semiconductor device 400 provides more of an interface between metal contacts 425 and the corresponding source/drain 415 (e.g., relative to the island patterning technique), which reduces resistance between metal contacts 425 and the corresponding source/drain 415 (e.g., relative to the island patterning technique).

In this way, semiconductor device 400, described in connection with FIG. 4, enables metal contacts 425 electrically coupled to corresponding metal-to-source/drain plugs 415 of semiconductor device 400 to be separated by less than nineteen nanometers, in range from approximately eight nanometers to less than nineteen nanometers, and/or the like. Thus, semiconductor device 400 may be utilized for the semiconductor designs that indicate that metal contacts 425 are to be separated by less than nineteen nanometers. Furthermore, semiconductor device 400 provides a better interface between metal contacts 425 and the corresponding metal-to-source/drain plugs 415 (e.g., relative to the island patterning technique), which reduces resistance between metal contacts 425 and source/drain 415 (e.g., relative to the island patterning technique).

Figure 5:
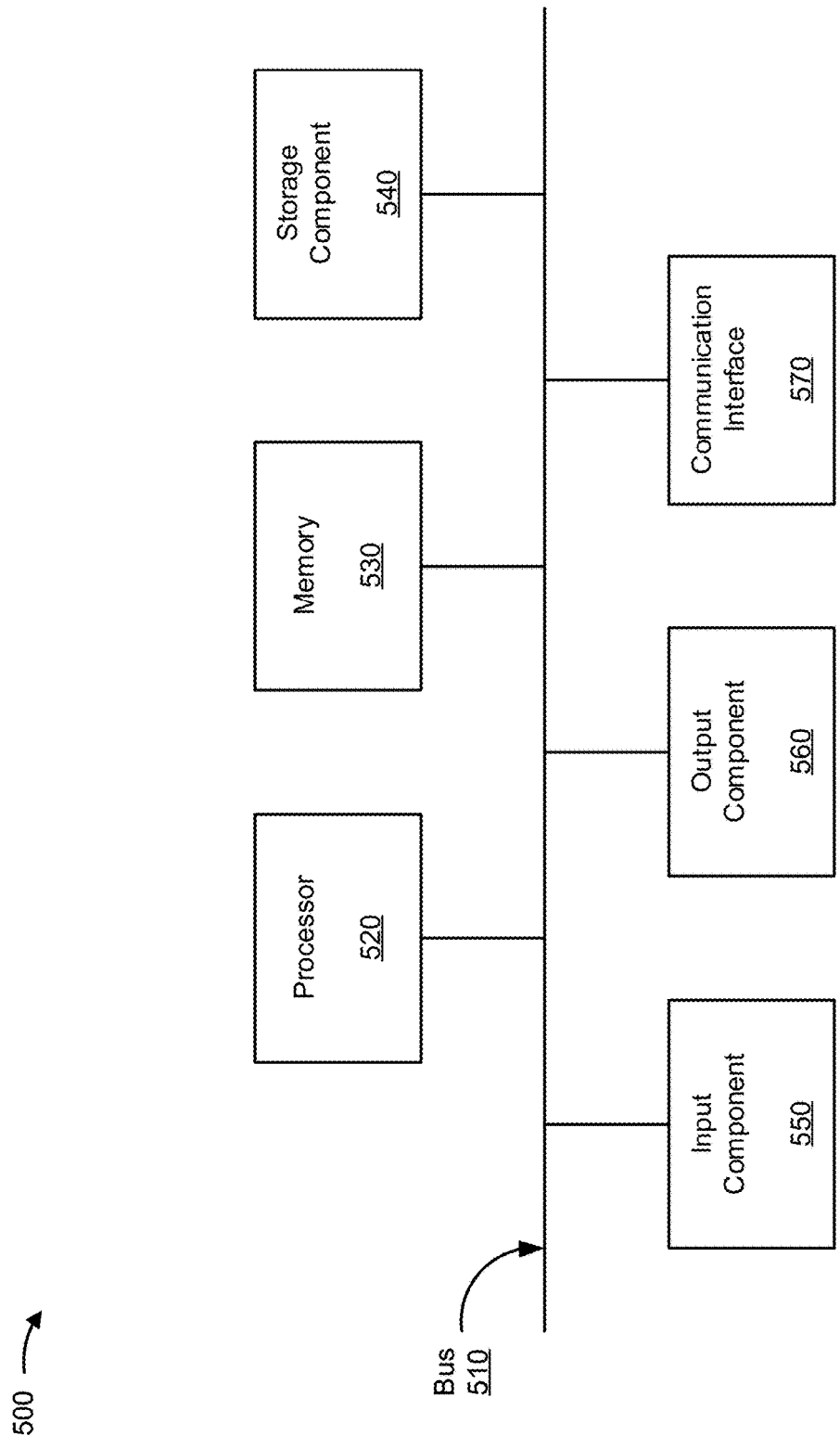
FIG. 5 is a diagram of example components of one or more devices of FIG. 1.

FIG. 5 is a diagram of example components of a device 500. Device 500 may correspond to the deposition tool, the photoresist tool, the etch tool, the metal tool, and/or the CMP tool. In some implementations, the deposition tool, the photoresist tool, the etch tool, the metal tool, and/or the CMP tool may include one or more devices 500 and/or one or more components of device 500. As shown in FIG. 5, device 500 may include a bus 510, a processor 520, a memory 530, a storage component 540, an input component 550, an output component 560, and a communication interface 570.

Bus 510 includes a component that permits communication among the components of device 500. Processor 520 is implemented in hardware, firmware, or a combination of hardware and software. Processor 520 is a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some implementations, processor 520 includes one or more processors capable of being programmed to perform a function. Memory 530 includes a random access memory (RAM), a read only memory (ROM), and/or another type of dynamic or static storage device (e.g., a flash memory, a magnetic memory, and/or an optical memory) that stores information and/or instructions for use by processor 520.

Storage component 540 stores information and/or software related to the operation and use of device 500. For example, storage component 540 may include a hard disk (e.g., a magnetic disk, an optical disk, a magneto-optic disk, and/or a solid state disk), a compact disc (CD), a digital versatile disc (DVD), a floppy disk, a cartridge, a magnetic tape, and/or another type of non-transitory computer-readable medium, along with a corresponding drive.

Input component 550 includes a component that permits device 500 to receive information, such as via user input (e.g., a touch screen display, a keyboard, a keypad, a mouse, a button, a switch, and/or a microphone). Additionally, or alternatively, input component 550 may include a sensor for sensing information (e.g., a global positioning system (GPS) component, an accelerometer, a gyroscope, and/or an actuator). Output component 560 includes a component that provides output information from device 500 (e.g., a display, a speaker, and/or one or more LEDs).

Communication interface 570 includes a transceiver-like component (e.g., a transceiver and/or a separate receiver and transmitter) that enables device 500 to communicate with other devices, such as via a wired connection, a wireless connection, or a combination of wired and wireless connections. Communication interface 570 may permit device 500 to receive information from another device and/or provide information to another device. For example, communication interface 570 may include an Ethernet interface, an optical interface, a coaxial interface, an infrared interface, an RF interface, a universal serial bus (USB) interface, a wireless local area interface, a cellular network interface, and/or the like.

Device 500 may perform one or more processes described herein. Device 500 may perform these processes based on processor 520 executing software instructions stored by a non-transitory computer-readable medium, such as memory 530 and/or storage component 540. A computer-readable medium is defined herein as a non-transitory memory device. A memory device includes memory space within a single physical storage device or memory space spread across multiple physical storage devices.

Software instructions may be read into memory 530 and/or storage component 540 from another computer-readable medium or from another device via communication interface 570. When executed, software instructions stored in memory 530 and/or storage component 540 may cause processor 520 to perform one or more processes described herein. Additionally, or alternatively, hardwired circuitry may be used in place of or in combination with software instructions to perform one or more processes described herein. Thus, implementations described herein are not limited to any specific combination of hardware circuitry and software.

The number and arrangement of components shown in FIG. 5 are provided as an example. In practice, device 500 may include additional components, fewer components, different components, or differently arranged components than those shown in FIG. 5. Additionally, or alternatively, a set of components (e.g., one or more components) of device 500 may perform one or more functions described as being performed by another set of components of device 500.

Figure 6:
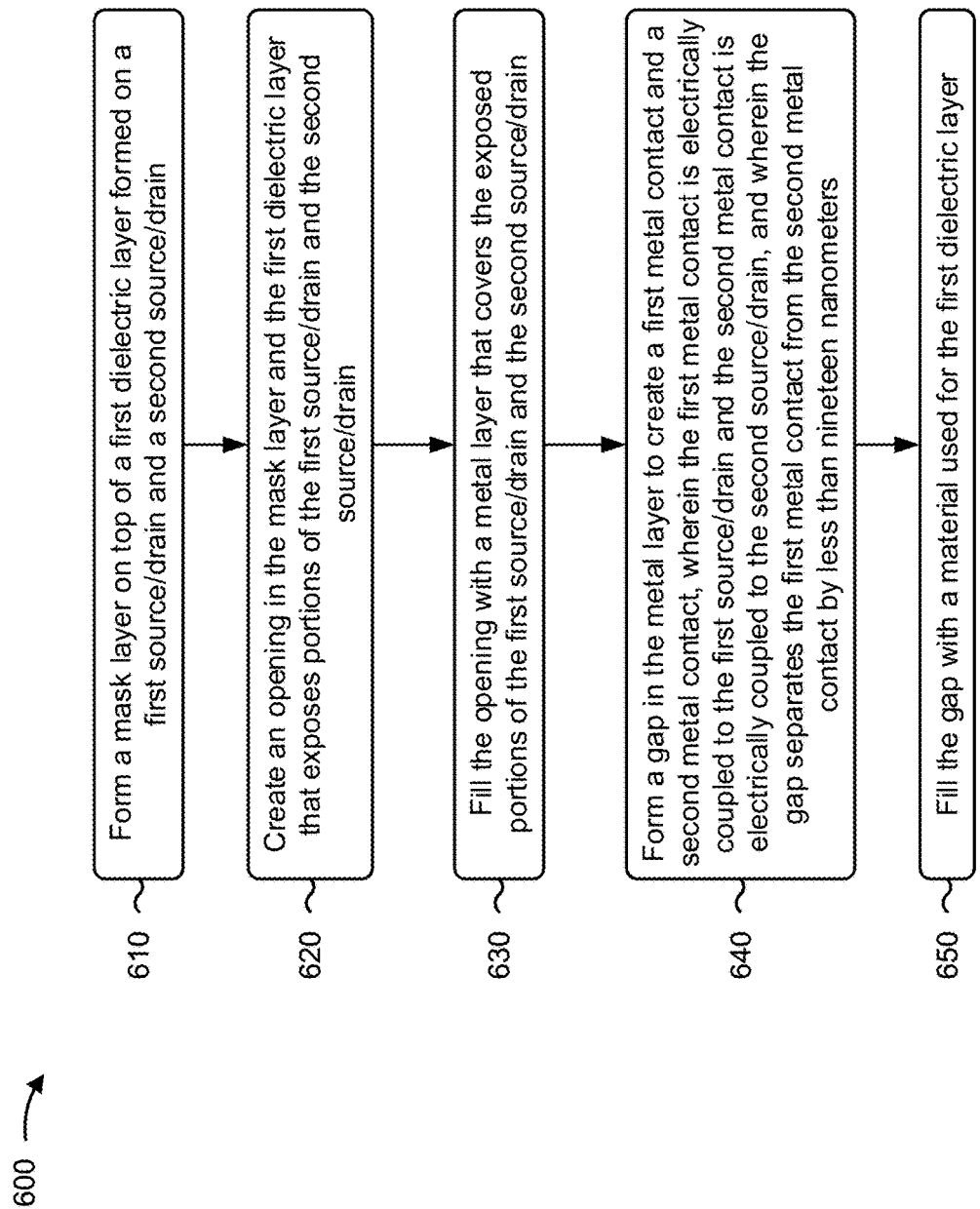
FIGS. 6 and 7 are flowcharts of example processes for manufacturing the example semiconductor device based on gap patterning for metal-to-source/drain plugs in the example semiconductor device.

FIG. 6 is a flow chart of an example process 600 for manufacturing an example semiconductor device based on gap patterning for metal-to-source/drain plugs in the example semiconductor device. In some implementations, one or more process blocks of FIG. 6 may be performed by a tool configuration (e.g., the tool configuration of FIG. 1). In some implementations, one or more process blocks of FIG. 6 may be performed by another device or a group of devices separate from or including the tool configuration.

As shown in FIG. 6, process 600 may include forming a mask layer on top of a first dielectric layer formed on a first source/drain and a second source/drain (block 610). For example, the tool configuration may form a mask layer on top of a first dielectric layer formed on a first source/drain and a second source/drain, as described above.

As further shown in FIG. 6, process 600 may include creating an opening in the mask layer and the first dielectric layer that exposes portions of the first source/drain and the second source/drain (block 620). For example, the tool configuration may create an opening in the mask layer and the first dielectric layer that exposes portions of the first source/drain and the second source/drain, as described above.

As further shown in FIG. 6, process 600 may include filling the opening with a metal layer that covers the exposed portions of the first source/drain and the second source/drain (block 630). For example, the tool configuration may fill the opening with a metal layer that covers the exposed portions of the first source/drain and the second source/drain, as described above.

As further shown in FIG. 6, process 600 may include forming a gap in the metal layer to create a first metal contact and a second metal contact, wherein the first metal contact is electrically coupled to the first source/drain and the second metal contact is electrically coupled to the second source/drain, and wherein the gap separates the first metal contact from the second metal contact by less than nineteen nanometers (block 640). For example, the tool configuration may form a gap in the metal layer to create a first metal contact and a second metal contact, as described above. In some implementations, the first metal contact is electrically coupled to the first source/drain and the second metal contact is electrically coupled to the second source/drain. In some implementations, the gap separates the first metal contact from the second metal contact by less than nineteen nanometers.

As further shown in FIG. 6, process 600 may include filling the gap with a material used for the first dielectric layer (block 650). For example, the tool configuration may fill the gap with a material used for the first dielectric layer (or with materials used for other types of dielectric layers), as described above.

Process 600 may include additional implementations, such as any single implementation or any combination of implementations described below and/or in connection with one or more other processes described elsewhere herein.

In a first implementation, process 600 includes forming a second dielectric layer on top of the first dielectric layer, the first metal contact, and the second metal contact; creating a first via in the second dielectric layer to expose a portion of the first metal contact; creating a second via in the second dielectric layer to expose a portion of the second metal contact; filling the first via to create a third metal contact that is electrically coupled to the first metal contact; and filling the second via to create a fourth metal contact that is electrically coupled to the second metal contact.

In a second implementation, alone or in combination with the first implementation, creating the opening in the mask layer and the first dielectric layer includes forming a photoresist layer above portions of the mask layer and the first dielectric layer, and performing one or more etching operations to remove portions of the mask layer and the first dielectric layer other than the portions of the mask layer and the first dielectric layer formed below the photoresist layer, where the removed portions of the mask layer and the first dielectric layer correspond to the opening that exposes portions of the first source/drain and the second source/drain.

In a third implementation, alone or in combination with one or more of the first and second implementations, process 600 includes polishing the metal layer to be substantially planar with the first dielectric layer and to remove the mask layer, prior to forming the gap in the metal layer.

In a fourth implementation, alone or in combination with one or more of the first through third implementations, forming the gap in the metal layer includes forming a photoresist layer above portions of the metal layer and the first dielectric layer except a portion of the metal layer associated with the gap, and performing one or more etching operations to remove the portion of metal layer, where the removed portion of the metal layer corresponds to the gap in the metal layer.

In a fifth implementation, alone or in combination with one or more of the first through fourth implementations, forming the gap in the metal layer includes forming a bottom layer on top of the metal layer and the first dielectric layer; forming a middle layer on top of the bottom layer; forming a photoresist layer above portions of the metal layer, the first dielectric layer, the bottom layer, and the middle layer, except a portion of the metal layer associated with the gap; and performing one or more etching operations to remove the portion of metal layer, the entire photoresist layer, the entire bottom layer, and the entire middle layer, where the removed portion of the metal layer corresponds to the gap in the metal layer.

In a sixth implementation, alone or in combination with one or more of the first through fifth implementations, creating the opening in the mask layer and the first dielectric layer includes forming a bottom layer on top of the mask layer; forming a middle layer on top of the bottom layer; forming a photoresist layer above portions of the first dielectric layer, the mask layer, the bottom layer, and the middle layer; and performing one or more etching operations to remove the entire photoresist layer, the entire bottom layer, the entire middle layer, and portions of the mask layer and the first dielectric layer other than the portions of the mask layer and the first dielectric layer formed below the photoresist layer, where the removed portions of the mask layer and the first dielectric layer correspond to the opening that exposes portions of the first source/drain and the second source/drain.

In a seventh implementation, alone or in combination with one or more of the first through sixth implementations, the semiconductor device includes a substrate with fins and an insulation layer formed on top of the substrate, where one or more first fins electrically couple to the first source/drain and one or more second fins electrically couple to the second source/drain.

Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

Figure 7:
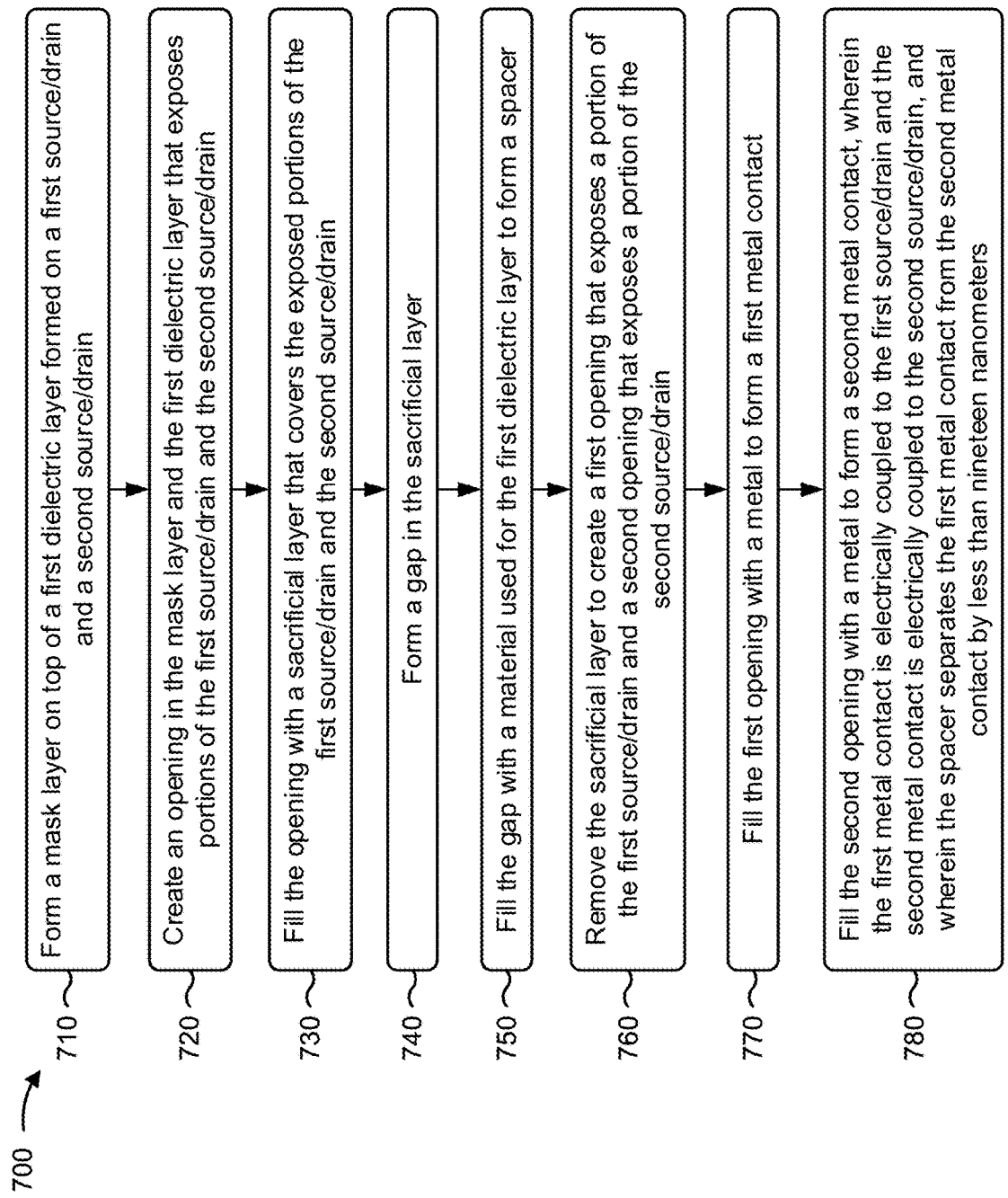

FIG. 7 is a flow chart of an example process 700 for manufacturing an example semiconductor device based on gap patterning for metal-to-source/drain plugs in the example semiconductor device. In some implementations, one or more process blocks of FIG. 7 may be performed by a tool configuration (e.g., the tool configuration of FIG. 1). In some implementations, one or more process blocks of FIG. 7 may be performed by another device or a group of devices separate from or including the tool configuration.

As shown in FIG. 7, process 700 may include forming a mask layer on top of a first dielectric layer formed on a first source/drain and a second source/drain (block 710). For example, the tool configuration may form a mask layer on top of a first dielectric layer formed on a first source/drain and a second source/drain, as described above.

As further shown in FIG. 7, process 700 may include creating an opening in the mask layer and the first dielectric layer that exposes portions of the first source/drain and the second source/drain (block 720). For example, the tool configuration may create an opening in the mask layer and the first dielectric layer that exposes portions of the first source/drain and the second source/drain, as described above.

As further shown in FIG. 7, process 700 may include filling the opening with a sacrificial layer that covers the exposed portions of the first source/drain and the second source/drain (block 730). For example, the tool configuration may fill the opening with a sacrificial layer that covers the exposed portions of the first source/drain and the second source/drain, as described above.

As further shown in FIG. 7, process 700 may include forming a gap in the sacrificial layer (block 740). For example, the tool configuration may form a gap in the sacrificial layer, as described above.

As further shown in FIG. 7, process 700 may include filling the gap with a material used for the first dielectric layer to form a spacer (block 750). For example, the tool configuration may fill the gap with a material used for the first dielectric layer to form a spacer (or with materials used for other types of dielectric layers), as described above.

As further shown in FIG. 7, process 700 may include removing the sacrificial layer to create a first opening that exposes a portion of the first source/drain and a second opening that exposes a portion of the second source/drain (block 760). For example, the tool configuration may remove the sacrificial layer to create a first opening that exposes a portion of the first source/drain and a second opening that exposes a portion of the second source/drain, as described above.

As further shown in FIG. 7, process 700 may include filling the first opening with a metal to form a first metal contact (block 770). For example, the tool configuration may fill the first opening with a metal to form a first metal contact, as described above.

As further shown in FIG. 7, process 700 may include filling the second opening with a metal to form a second metal contact, wherein the first metal contact is electrically coupled to the first source/drain and the second metal contact is electrically coupled to the second source/drain, and wherein the spacer separates the first metal contact from the second metal contact by less than nineteen nanometers (block 780). For example, the tool configuration may fill the second opening with a metal to form a second metal contact, as described above. In some implementations, the first metal contact is electrically coupled to the first source/drain and the second metal contact is electrically coupled to the second source/drain. In some implementations, the spacer separates the first metal contact from the second metal contact by less than nineteen nanometers.

Process 700 may include additional implementations, such as any single implementation or any combination of implementations described below and/or in connection with one or more other processes described elsewhere herein.

In a first implementation, process 700 includes forming a second dielectric layer on top of the first dielectric layer, the first metal contact, and the second metal contact; creating a first via in the second dielectric layer to expose a portion of the first metal contact; creating a second via in the second dielectric layer to expose a portion of the second metal contact; filling the first via to form a third metal contact that is electrically coupled to the first metal contact; and filling the second via to form a fourth metal contact that is electrically coupled to the second metal contact.

In a second implementation, alone or in combination with the first implementation, creating the opening in the mask layer and the first dielectric layer includes forming a photoresist layer above portions of the mask layer and the first dielectric layer, and performing one or more etching operations to remove portions of the mask layer and the first dielectric layer other than the portions of the mask layer and the first dielectric layer formed below the photoresist layer, where the removed portions of the mask layer and the first dielectric layer correspond to the opening that exposes portions of the first source/drain and the second source/drain.

In a third implementation, alone or in combination with one or more of the first and second implementations, process 700 includes polishing the sacrificial layer to be substantially planar with the first dielectric layer and to remove the mask layer, prior to forming the gap in the sacrificial layer.

In a fourth implementation, alone or in combination with one or more of the first through third implementations, forming the gap in the sacrificial layer includes forming a photoresist layer above portions of the sacrificial layer and the first dielectric layer except a portion of the sacrificial layer associated with the gap, and performing one or more etching operations to remove the portion of sacrificial layer, where the removed portion of the sacrificial layer corresponds to the gap in the sacrificial layer.

In a fifth implementation, alone or in combination with one or more of the first through fourth implementations, forming the gap in the sacrificial layer includes forming a bottom layer on top of the sacrificial layer and the first dielectric layer; forming a middle layer on top of the bottom layer; forming a photoresist layer above portions of the sacrificial layer, the first dielectric layer, the bottom layer, and the middle layer, except a portion of the sacrificial layer associated with the gap; and performing one or more etching operations to remove the portion of sacrificial layer, the entire photoresist layer, the entire bottom layer, and the entire middle layer, where the removed portion of the sacrificial layer corresponds to the gap in the sacrificial layer.

In a sixth implementation, alone or in combination with one or more of the first through fifth implementations, creating the opening in the mask layer and the first dielectric layer includes forming a bottom layer on top of the mask layer; forming a middle layer on top of the bottom layer; forming a photoresist layer above portions of the first dielectric layer, the mask layer, the bottom layer, and the middle layer; and performing one or more etching operations to remove the entire photoresist layer, the entire bottom layer, the entire middle layer, and portions of the mask layer and the first dielectric layer other than the portions of the mask layer and the first dielectric layer formed below the photoresist layer, where the removed portions of the mask layer and the first dielectric layer correspond to the opening that exposes portions of the first source/drain and the second source/drain.

In a seventh implementation, alone or in combination with one or more of the first through sixth implementations, an angle formed based on a sidewall of the first metal contact or the second metal contact and based on a top surface of the insulation layer is in a range from approximately eighty-eight degrees to approximately ninety-two degrees.

In an eighth implementation, alone or in combination with one or more of the first through seventh implementations, a distance from a sidewall of the first metal contact to the first source/drain is in a range from approximately ten nanometers to approximately sixty-six nanometers.

In a ninth implementation, alone or in combination with one or more of the first through eighth implementations, a distance from a sidewall of the first metal contact to a sidewall of the second metal contact is in a range from approximately eight nanometers to nineteen nanometers.

Although FIG. 7 shows example blocks of process 700, in some implementations, process 700 may include additional blocks, fewer blocks, different blocks, or differently arranged blocks than those depicted in FIG. 7. Additionally, or alternatively, two or more of the blocks of process 700 may be performed in parallel.

In this way, a method for manufacturing semiconductor device 400 may be based on gap patterning for metal-to-source/drain plugs 415 in semiconductor device 400. The method enables metal contacts 425 electrically coupled to corresponding source/drain 415 of semiconductor device 400 to be separated by less than a minimum distance (e.g., less than nineteen nm) provided by the island patterning technique. Thus, the method may be utilized for semiconductor designs. Furthermore, the method provides more of an interface between metal contacts 425 and the corresponding source/drain-415 (e.g., relative to the island patterning technique), which reduces resistance between metal contacts 425 and the corresponding source/drain 415 (e.g., relative to the island patterning technique).

As described in greater detail above, some implementations described herein provide a method for manufacturing a semiconductor device. The method may include providing a mask layer on top of a first dielectric layer provided on a first source/drain and a second source/drain, and creating an opening in the mask layer and the first dielectric layer that exposes portions of the first source/drain and the second source/drain. The method may include filling the opening with a metal layer that covers the exposed portions of the first source/drain and the second source/drain, and forming a gap in the metal layer to create a first metal contact and a second metal contact. The first metal contact may electrically couple to the first source/drain and the second metal contact may electrically couple to the second source/drain. The gap may separate the first metal contact from the second metal contact by less than nineteen nanometers. The method may include filling the gap with a material used for the first dielectric layer.

As described in greater detail above, some implementations described herein provide a method for manufacturing a semiconductor device. The method may include providing a mask layer on top of a first dielectric layer provided on a first source/drain and a second source/drain, and creating an opening in the mask layer and the first dielectric layer that exposes portions of the first source/drain and the second source/drain. The method may include filling the opening with a sacrificial layer that covers the exposed portions of the first source/drain and the second source/drain, and forming a gap in the sacrificial layer. The method may include filling the gap with a material used for the first dielectric layer to form a spacer, and removing the sacrificial layer to create a first opening that exposes a portion of the first source/drain and a second opening that exposes a portion of the second source/drain. The method may include filling the first opening with a metal to form a first metal contact, and filling the second opening with a metal to form a second metal contact. The first metal contact may electrically couple to the first source/drain and the second metal contact may electrically couple to the second source/drain. The spacer may separate the first metal contact from the second metal contact by less than nineteen nanometers.

As described in greater detail above, some implementations described herein provide a semiconductor device with a substrate layer that includes a plurality of fins, and an insulation layer formed on top of the substrate layer. The semiconductor device may include a first source/drain electrically coupled to one or more first fins of the plurality of fins, and a second source/drain spaced from the first source/drain and electrically coupled to one or more second fins of the plurality of fins. The semiconductor device may include a first metal contact electrically coupled to the first source/drain, a second metal contact electrically coupled to the second source/drain, and a dielectric layer to separate the first metal contact from the second metal contact by less than nineteen nanometers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that those skilled in the art may make various changes, substitutions, and alterations herein without departing from the spirit and scope of the present disclosure.

What is claimed is:

1. A method for manufacturing a semiconductor device, the method comprising:
   forming a mask layer on top of a first dielectric layer formed on a first source/drain and a second source/drain;
   creating an opening in the mask layer and the first dielectric layer that exposes portions of the first source/drain and the second source/drain;
   filling the opening with a metal layer that covers the exposed portions of the first source/drain and the second source/drain;
   forming a gap in the metal layer to create a first metal contact and a second metal contact,
     wherein the first metal contact is electrically coupled to the first source/drain and the second metal contact is electrically coupled to the second source/drain, and
     wherein the gap separates the first metal contact from the second metal contact by less than nineteen nanometers; and
   filling the gap with a same material used for the first dielectric layer.

2. The method of claim 1, further comprising:
   forming a second dielectric layer on top of the first dielectric layer, the first metal contact, and the second metal contact;
   creating a first via in the second dielectric layer to expose a portion of the first metal contact;
   creating a second via in the second dielectric layer to expose a portion of the second metal contact;
   filling the first via to create a third metal contact that is electrically coupled to the first metal contact; and
   filling the second via to create a fourth metal contact that is electrically coupled to the second metal contact.

3. The method of claim 1, wherein creating the opening in the mask layer and the first dielectric layer comprises:
   forming a photoresist layer above portions of the mask layer and the first dielectric layer; and
   performing one or more etching operations to remove portions of the mask layer and the first dielectric layer other than the portions of the mask layer and the first dielectric layer formed below the photoresist layer,
     wherein the removed portions of the mask layer and the first dielectric layer correspond to the opening that exposes portions of the first source/drain and the second source/drain.

4. The method of claim 1, further comprising:
   polishing the metal layer to be substantially planar with the first dielectric layer and to remove the mask layer, prior to forming the gap in the metal layer.

5. The method of claim 1, wherein forming the gap in the metal layer comprises:
   forming a photoresist layer above portions of the metal layer and the first dielectric layer except a portion of the metal layer associated with the gap; and performing one or more etching operations to remove the portion of the metal layer,
wherein the removed portion of the metal layer corresponds to the gap in the metal layer.

6. The method of claim 1, wherein forming the gap in the metal layer comprises:
forming a bottom layer on top of the metal layer and the first dielectric layer;
forming a middle layer on top of the bottom layer;
forming a photoresist layer above portions of the metal layer, the first dielectric layer, the bottom layer, and the middle layer, except a portion of the metal layer associated with the gap; and
performing one or more etching operations to remove the portion of the metal layer, the photoresist layer, the bottom layer, and the middle layer,
wherein the removed portion of the metal layer corresponds to the gap in the metal layer.

7. The method of claim 1, wherein creating the opening in the mask layer and the first dielectric layer comprises:
forming a bottom layer on top of the mask layer;
forming a middle layer on top of the bottom layer;
forming a photoresist layer above portions of the first dielectric layer, the mask layer, the bottom layer, and the middle layer; and
performing one or more etching operations to remove the photoresist layer, the bottom layer, the middle layer, and portions of the mask layer and the first dielectric layer other than the portions of the mask layer and the first dielectric layer formed below the photoresist layer,
wherein the removed portions of the mask layer and the first dielectric layer correspond to the opening that exposes portions of the first source/drain and the second source/drain.

8. The method of claim 1, wherein the semiconductor device includes a substrate with fins and an insulation layer formed on top of the substrate,
wherein one or more first fins electrically couple to the first source/drain and one or more second fins electrically couple to the second source/drain.

9. A device, comprising:
one or more memories; and
one or more processors, coupled to the one or more memories, configured to:
form a mask layer on top of a first dielectric layer formed on a first source/drain and a second source/drain;
create an opening in the mask layer and the first dielectric layer that exposes portions of the first source/drain and the second source/drain;
fill the opening with a metal layer that covers the exposed portions of the first source/drain and the second source/drain;
form a gap in the metal layer to create a first metal contact and a second metal contact,
wherein the first metal contact is electrically coupled to the first source/drain and the second metal contact is electrically coupled to the second source/drain, and
wherein the gap separates the first metal contact from the second metal contact by less than nineteen nanometers; and
fill the gap with a same material used for the first dielectric layer.

10. The device of claim 9, wherein the one or more processors, to create the opening in the mask layer and the first dielectric layer, are configured to:
form a photoresist layer above portions of the mask layer and the first dielectric layer; and
perform one or more etching operations to remove portions of the mask layer and the first dielectric layer other than the portions of the mask layer and the first dielectric layer formed below the photoresist layer,
wherein the removed portions of the mask layer and the first dielectric layer correspond to the opening that exposes portions of the first source/drain and the second source/drain.

11. The device of claim 9, wherein the one or more processors are further configured to:
polish the metal layer to be substantially planar with the first dielectric layer and to remove the mask layer, prior to forming the gap in the metal layer.

12. The device of claim 9, wherein the one or more processors, to form the gap in the metal layer, are configured to:
form a photoresist layer above portions of the metal layer and the first dielectric layer except a portion of the metal layer associated with the gap; and
perform one or more etching operations to remove the portion of the metal layer,
wherein the removed portion of the metal layer corresponds to the gap in the metal layer.

13. The device of claim 9, wherein the one or more processors, to form the gap in the metal layer, are configured to:
form a bottom layer on top of the metal layer and the first dielectric layer;
form a middle layer on top of the bottom layer;
form a photoresist layer above portions of the metal layer, the first dielectric layer, the bottom layer, and the middle layer, except a portion of the metal layer associated with the gap; and
perform one or more etching operations to remove the portion of the metal layer, the photoresist layer, the bottom layer, and the middle layer,
wherein the removed portion of the metal layer corresponds to the gap in the metal layer.

14. The device of claim 9, wherein the one or more processors, to create the opening in the mask layer and the first dielectric layer, are configured to:
form a bottom layer on top of the mask layer;
form a middle layer on top of the bottom layer;
form a photoresist layer above portions of the first dielectric layer, the mask layer, the bottom layer, and the middle layer; and
perform one or more etching operations to remove the photoresist layer, the bottom layer, the middle layer, and portions of the mask layer and the first dielectric layer other than the portions of the mask layer and the first dielectric layer formed below the photoresist layer,
wherein the removed portions of the mask layer and the first dielectric layer correspond to the opening that exposes portions of the first source/drain and the second source/drain.

15. A non-transitory computer-readable medium storing a set of instructions, the set of instructions comprising:
one or more instructions that, when executed by one or more processors of a device, cause the device to:
form a mask layer on top of a first dielectric layer formed on a first source/drain and a second source/drain;
create an opening in the mask layer and the first dielectric layer that exposes portions of the first source/drain and the second source/drain;

fill the opening with a metal layer that covers the exposed portions of the first source/drain and the second source/drain;
form a gap in the metal layer to create a first metal contact and a second metal contact,
   wherein the first metal contact is electrically coupled to the first source/drain and the second metal contact is electrically coupled to the second source/drain, and
   wherein the gap separates the first metal contact from the second metal contact by less than nineteen nanometers; and
fill the gap with a same material used for the first dielectric layer.

16. The non-transitory computer-readable medium of claim 15, wherein the one or more instructions, that cause the device to create the opening in the mask layer and the first dielectric layer, cause the device to:
   form a photoresist layer above portions of the mask layer and the first dielectric layer; and
   perform one or more etching operations to remove portions of the mask layer and the first dielectric layer other than the portions of the mask layer and the first dielectric layer formed below the photoresist layer,
      wherein the removed portions of the mask layer and the first dielectric layer correspond to the opening that exposes portions of the first source/drain and the second source/drain.

17. The non-transitory computer-readable medium of claim 15, wherein the one or more instructions further cause the device to:
   polish the metal layer to be substantially planar with the first dielectric layer and to remove the mask layer, prior to forming the gap in the metal layer.

18. The non-transitory computer-readable medium of claim 15, wherein the one or more instructions, that cause the device to form the gap in the metal layer, cause the device to:
   form a photoresist layer above portions of the metal layer and the first dielectric layer except a portion of the metal layer associated with the gap; and
   perform one or more etching operations to remove the portion of the metal layer,
      wherein the removed portion of the metal layer corresponds to the gap in the metal layer.

19. The non-transitory computer-readable medium of claim 15, wherein the one or more instructions, that cause the device to form the gap in the metal layer, cause the device to:
   form a bottom layer on top of the metal layer and the first dielectric layer;
   form a middle layer on top of the bottom layer;
   form a photoresist layer above portions of the metal layer, the first dielectric layer, the bottom layer, and the middle layer, except a portion of the metal layer associated with the gap; and
   perform one or more etching operations to remove the portion of the metal layer, the photoresist layer, the bottom layer, and the middle layer,
      wherein the removed portion of the metal layer corresponds to the gap in the metal layer.

20. The non-transitory computer-readable medium of claim 15, wherein the one or more instructions, that cause the device to create the opening in the mask layer and the first dielectric layer, cause the device to:
   form a bottom layer on top of the mask layer;
   form a middle layer on top of the bottom layer;
   form a photoresist layer above portions of the first dielectric layer, the mask layer, the bottom layer, and the middle layer; and
   perform one or more etching operations to remove the photoresist layer, the bottom layer, the middle layer, and portions of the mask layer and the first dielectric layer other than the portions of the mask layer and the first dielectric layer formed below the photoresist layer,
      wherein the removed portions of the mask layer and the first dielectric layer correspond to the opening that exposes portions of the first source/drain and the second source/drain.

\* \* \* \* \*